(12) United States Patent
McDermott et al.

(10) Patent No.: US 8,861,619 B2
(45) Date of Patent: Oct. 14, 2014

(54) SYSTEM AND METHOD FOR HIGH-FREQUENCY AMPLIFIER

(75) Inventors: Robert Francis McDermott, Madison, WI (US); David Hover, Madison, WI (US); Guilhem Jean-Antoine Ribeill, Madison, WI (US); Yung-Fu Chen, Taipei (TW)

(73) Assignee: Wisconsin Alumni Research Foundation, Madison, WI (US)

( * ) Notice: Subject to any disclaimer, the term of this patent is extended or adjusted under 35 U.S.C. 154(b) by 519 days.

(21) Appl. No.: 13/210,874

(22) Filed: Aug. 16, 2011

(65) Prior Publication Data

US 2013/0043945 A1 Feb. 21, 2013

(51) Int. Cl.
*H04L 25/00* (2006.01)
*H03F 3/195* (2006.01)

(52) U.S. Cl.
CPC .......... *H03F 3/195* (2013.01); *H03F 2200/534* (2013.01)
USPC ......... 375/257; 375/295; 330/124 R; 330/188

(58) Field of Classification Search
CPC ... H03F 3/195; H03F 2200/534; H03F 19/00; H03K 19/1952; H03K 19/1954; H01L 27/18
USPC ............... 375/257, 295, 297; 330/124 R, 188
See application file for complete search history.

(56) References Cited

U.S. PATENT DOCUMENTS 6,486,756 B2 * 11/2002 Tarutani et al. ............... 333/99 S
7,095,227 B2 * 8/2006 Tarutani et al. ............... 324/248

OTHER PUBLICATIONS

Castellanos-Beltran et al, Amplification and squeezing of quantum noise with a tunable Josephson metamaterial, Nature Physics 4, 9290931 (2008).
McDermott, Development of tunable resonators and SQUID amplifiers for high fidelity gates and readout of low-Z flux qubits, Oct. 20, 2010.
Ketchen, Surface-Code Multi-Qubit Functionality with Superconducting Qubits, IBM TJ Watson Research Center, Aug. 18, 2010.
McDermott, University of Wisconsin presentation by Dr. McDermott, Aug. 18, 2010.
McDermott et al, Quantum-Limited Measurement as a Tool for Entanglement in Superconducting Circuits, Apr. 2010.
Ribeill et al, SLUG Microwave Amplifier: Theory, Dept of Physics, Univ. of WI Madison, WI, Jun./Jul. 2011.
Van Harlingen et al, Superconducting quantum interface device with very low magnetic flux noise energy, 1982 American Institute of Physics, Appl. Phys, Lett. 41(2) 15 Jul. 7, 1982.

* cited by examiner

*Primary Examiner* — Leon Flores
(74) *Attorney, Agent, or Firm* — Quarles & Brady, LLP

(57) ABSTRACT

A system and method for operating an amplifier system is provided. The amplifier system includes an input providing a direct coupling configured to receive a high-frequency input signal having a frequency in at least one of a radiofrequency (RF) and microwave range. The amplifier system also includes an amplifier including a dielectric material separating at least two superconducting layers forming an amplifier loop configured to receive the high-frequency input signal and deliver an amplified signal. The amplifier system includes an output providing a direct coupling configured to deliver the amplified signal.

18 Claims, 24 Drawing Sheets

SYSTEM AND METHOD FOR HIGH-FREQUENCY AMPLIFIER

STATEMENT REGARDING FEDERALLY SPONSORED RESEARCH

This invention was made with government support under FA9550-09-1-0039 awarded by the USAF/AFOSR, W911NF-10-1-0334 awarded by the ARMY/ARO, and W911NF-10-1-0324 awarded by the ARMY/ARO. The government has certain rights in the invention.

CROSS-REFERENCE TO RELATED APPLICATIONS

N/A

FIELD OF THE INVENTION

The invention relates to a system and method for a high-frequency amplifier and, more particularly, to a system and method for a low-noise phase insensitive high-frequency amplifier.

BACKGROUND OF THE INVENTION

The rapid development of superconducting quantum electronics has motivated a search for quantum-limited amplifiers for the low-noise readout of qubits and linear cavity resonators. Conventional approaches have relied upon dc Superconducting QUantum Interference Devices (dc SQUID) that can achieve noise performance approaching the fundamental quantum limit imposed on phase-insensitive linear amplifiers—namely, the amplifier adds at least half a quantum of noise to the signal it amplifies.

Although approaches employing SQUID are, in principle, capable of amplifying signals at frequencies approaching the Josephson frequency (typically in the tens of GHz), it remains challenging to embed the SQUID in a traditional transmission line environment. As used herein, a transmission line or transmission line environment refers to a conductor, including a conductive trace in an integrated circuit (IC), that is specifically designed to carry alternating currents with sufficient frequencies for the signal to have properties of a wave. Such transmission line environments typically are a 50 Ohm ($\Omega$) or even 75$\Omega$ environment. Accordingly, it is challenging to utilize a traditional SQUID-based amplifier within a transmission line environment because it is difficult to match the inductive coupling input and the output of a SQUID-based amplifier to common transmission line environments. For example, the inductive coupling input of the SQUID-based amplifier presents not only an obvious inductive component but also substantial parasitic reactance. Modeling and accounting for these characteristics of the SQUID-based amplifier can be challenging, particularly, when the input signal is a weak microwave tone employed as a dispersive probe of the quantum state of a superconducting or semiconducting qubit.

For quantum information processing applications related to the low-noise readout of qubits and linear cavity resonators, one requires ultrasensitive amplifiers operating in the radiofrequency (RF) or microwave range. Using traditional amplifier designs, such as SQUID-based designs, it can be challenging to provide for efficient coupling of an RF or microwave signal to the device. For example, the parasitic capacitance of the SQUID-based amplifier substantially impedes the effectiveness of the amplifier architecture when utilized in the RF or microwave range. To combat the losses experienced with SQUID-based amplifiers when used in the RF or microwave range, some have attempted to tune the amplifier input to have a resonance matched to the expected input signal frequency. This strategy, though adding to the overall complexity of the circuit design and modeling capabilities and reducing the flexibility of a given SQUID-based amplifier to be utilized with a varied input frequency range, often fails in the RF and microwave frequency range due to the fact that coupling efficiency decreases significantly with increasing operating frequency.

Case in point, recently, it was shown that near quantum-limited performance can be achieved with a microstrip SQUID-based amplifier, where the input coil of the amplifier is configured as a microstrip resonator with the SQUID washer acting as a groundplane. In this case, the noise temperature of the microstrip SQUID amplifier, when cooled to millikelvin temperatures, was measured to be 47±10 mK and 48±5 mK at frequencies of 519 MHz and 612 MHz, respectively. This performance was more than an order of magnitude lower than the best semiconductor amplifiers available and within a factor of 2 of the quantum limit. However, efforts to extend the operating frequencies of these amplifiers into the gigahertz range are hampered by the fact that reduction of the length of the input resonator is coupled to reduction of the mutual inductance between the input coil and the SQUID. Alternative approaches have included the integration of a high-gain SQUID gradiometer into a coplanar waveguide resonator at a current antinode.

Accordingly, when used in higher-frequency applications, SQUID-based amplifiers tend to have substantially limiting characteristics that impede practical implementations. Specifically, SQUID-based amplifier devices have relatively low gain-bandwidth product in the microwave frequency range.

Thus, it would be desirable to have a system and method for processing and amplifying readout signals having characteristics commonly associated with quantum computing, particularly, when the signals reach frequencies in the RF and microwave range.

SUMMARY

The present invention overcomes the aforementioned drawbacks by providing a system and method for a low-noise, phase-insensitive linear amplifier capable of accommodating readout signals from quantum computing applications, even when such signals reach frequencies in the RF and microwave range. The amplifier can significantly improve the signal-to-noise ratio in delicate measurements of microwave signals or other high-frequency signals associated with, for example quantum computing or quantum communications. The amplifier incorporates a low-inductance device geometry that is relatively compact, straightforward to model at microwave frequencies, and readily integrated into a low-impedance RF or microwave transmission line environments. Moreover, the device's input and output can both be matched to a transmission-line impedances, such as 50 or 75$\Omega$ or the like, facilitating operation in, for example, a broadband system.

In accordance with one aspect of the invention, an amplifier system is provided to amplify high-frequency signals. The amplifier system includes an input providing a direct coupling configured to receive a high-frequency input signal having a frequency in at least one of a radiofrequency (RF) and microwave range. The amplifier system also includes an amplifier including a dielectric material separating at least two superconducting layers forming an amplifier loop configured to receive the high-frequency input signal and deliver an amplified signal. The amplifier system further includes an output providing a direct coupling configured to deliver the amplified signal.

In accordance with another aspect of the invention, a quantum information processing network is provided that is configured to receive and relay high-frequency signals. The quantum information processing network includes a signal source configured to act as at least one of a quantum computing source, a source of qubits, and a linear cavity resonator and transmits or reflects a high-frequency signal having a frequency in at least one of a radiofrequency (RF) and microwave range. The quantum information processing network also includes a transmission line communication system configured to have an approximately 50 ohm environment and configured to transmit and receive the high-frequency signal. The quantum information processing network further includes an amplifier coupled directly to the transmission line communication system through an input configured to receive the high-frequency signal and an output to deliver an amplified high-frequency signal.

The foregoing and other aspects and advantages of the invention will appear from the following description. In the description, reference is made to the accompanying drawings which form a part hereof, and in which there is shown by way of illustration a best mode and exemplary embodiment of the invention. Such embodiment does not necessarily represent the full scope of the invention, however, and reference is made therefore to the claims and herein for interpreting the scope of the invention.

DETAILED DESCRIPTION

Figure 1:
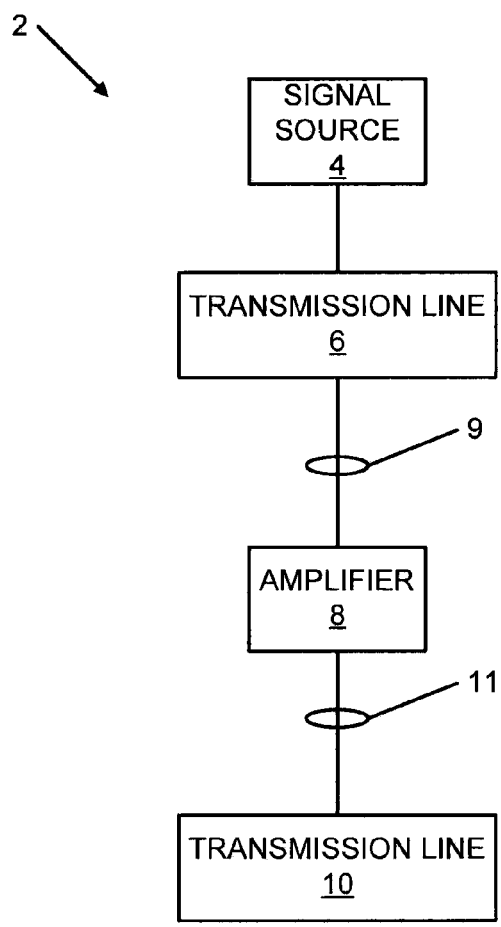
FIG. 1 is a schematic illustration of a system for communicating high-frequency signals in accordance with the present invention, such as may be found in quantum information processing networks and quantum computing applications.

Referring to FIG. 1, a schematic, block diagram is provided illustrating an exemplary device architecture incorporating the present amplifier system. System 10 includes signal source 4. Signal source 4 may include a high-frequency signal source in the range of RF or microwave (in one example, a signal having a frequency between approximately 1-10 GHz). The high-frequency signal source 4 may be a quantum computing device or another source of high-frequency communication signals, such as those found in satellite or space-based applications.

Signal source 4 is connected to input transmission line 6. In one implementation, transmission line 6 is an approximately 50 or 75Ω transmission line. Transmission line 6 is directly connected to amplifier 8. The transmission line 6 being "directly" connected to the amplifier 8, as will be described, refers to the transmission line 6 being connected to an integrated input matching network of the amplifier; this input network in turn has a direct electrical connection to the gain element and not an inductive or other coupling. That is, an input 9 of the amplifier 8 provides a direct coupling to the transmission line 6 to receive the output signal of the signal source 2. As described in detail below, amplifier 8 is a low-noise, phase-insensitive linear amplifier configured to amplify a signal received from signal source 4 through transmission line 6.

The amplifier 8 may also be directly connected to transmission line 10 that comprises a similar transmission line to that of the above-described transmission line 6. Thus, an output 11 of the amplifier 8 may be directly connected to the transmission line 10, as described above. For example, in one implementation, transmission line 10 is an approximately 50 or 75Ω transmission line. Thus, as illustrated, amplifier 8 is specifically designed to be coupled with a transmission line environment, such as illustrated by transmission line 6 and transmission line 10. The output of amplifier 8 can then be communicated through transmission line 10 to other devices and/or circuitry in communication with system 2.

Analysis of Traditional Squid-Based Amplifier Designs

Figure 2A:
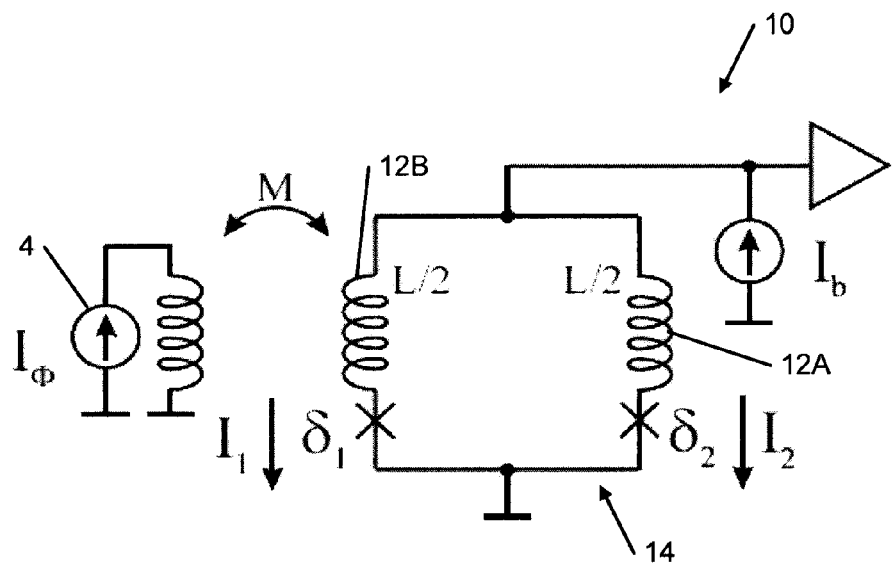
FIG. 2A is a circuit diagram of a traditional superconducting quantum interference device (SQUID) amplifier.

Referring now to FIG. 2A, a circuit diagram is provided illustrating a symmetric dc SQUID device 10. As shown in FIG. 2A, the gain element of the SQUID device consists of two overdamped Josephson junctions 12A and 12B embedded in a superconducting loop 14 with inductance L. The junctions (with gauge invariant phases $\delta_{1,2}$) have equal critical currents $I_0$, self-capacitances C, and shunt resistances R. The superconducting loop is formed from two equal branches, each with inductance L/2. In this model, the mutual inductance between the branches is not considered. A dc bias current $I_b$ and bias flux $\Phi_b$ establish a quasistatic operating point, and the signal from signal source 4 is injected into an input coil that is coupled to the SQUID loop 14 with mutual inductance M.

The currents through the junctions are given by equation (1):

$$I_1 = I_0 \sin\delta_1 + \frac{(V_1 - V_{n,1})}{R} + C\frac{dV_1}{dt} \qquad (1)$$

$$I_2 = I_0 \sin\delta_2 + \frac{(V_1 - V_{n,2})}{R} + C\frac{dV2_1}{dt},$$

In equation (1), $V_{n,1}$ and $V_{n,2}$ are noise voltages associated with the resistive shunts, and where the voltages $V_{1,2}$ are related to the junction phases by the ac Josephson relation shown in equation (2):

$$V_1 = \frac{\Phi_0}{2\pi}\frac{d\delta_1}{dt} \qquad (2)$$

$$V_2 = \frac{\Phi_0}{2\pi}\frac{d\delta_2}{dt}$$

In equation (2), $\Phi_0$=h/2e is the magnetic flux quantum. The SQUID amplifier 10 supports a circulating current J given by equation (3):

$$J = \frac{I_1 - I_2}{2}. \qquad (3)$$

The voltage across the device is given by equation (4):

$$V = V_1 + \frac{L}{2}\frac{dI_1}{dt} \qquad (4)$$

$$= V_2 + \frac{L}{2}\frac{dI_2}{dt}.$$

The circulating current and the junction phases are related to the total flux in the loop $\Phi_T$ as shown in equation (5).

$$\Phi_T = \Phi_b + LJ \qquad (5)$$

$$= \frac{\Phi_0}{2\pi}(\delta_2 - \delta_1).$$

In the analysis of the present SQUID device model 10, the dimensionless variables (i, v, $\Phi$, and $\theta$) are defined as follows: i≡I/$I_0$, v≡V/$I_0$R, $\Phi$≡$\Phi$/$\Phi_0$, and $\theta$≡t/[$\Phi_0$/2π$I_0$R)]. In addition, the dimensionless reduced inductance $C_L$=2$I_0$L/$\Phi_0$ and the damping parameter $\beta_C$=(2π/$\Phi_0$)$I_0$R$^2$C. The equations of motion for the junction phases are as shown in equation (6).

$$\beta_C\ddot\delta_1 = \frac{i_b}{2} + \frac{\delta_2 - \delta_1 - 2\pi\phi_b}{\pi\beta_L} - \sin\delta_1 - \dot\delta_1 + v_{n,1} \qquad (6)$$

$$\beta_C\ddot\delta_2 = \frac{i_b}{2} + \frac{\delta_2 - \delta_1 - 2\pi\phi_b}{\pi\beta_L} - \sin\delta_2 - \dot\delta_2 + v_{n,2}.$$

The quasistatic output voltage and circulating current are given by equations (7) and (8), respectively.

$$v_{out} = \frac{1}{2}(\delta_1 + \delta_2) \quad (7)$$

$$j = \frac{1}{\pi\beta_L}(\delta_2 - \delta_1 - 2\pi\phi_b). \quad (8)$$

EXAMPLE AMPLIFIER GEOMETRY AND ANALYSIS

Figure 2B:
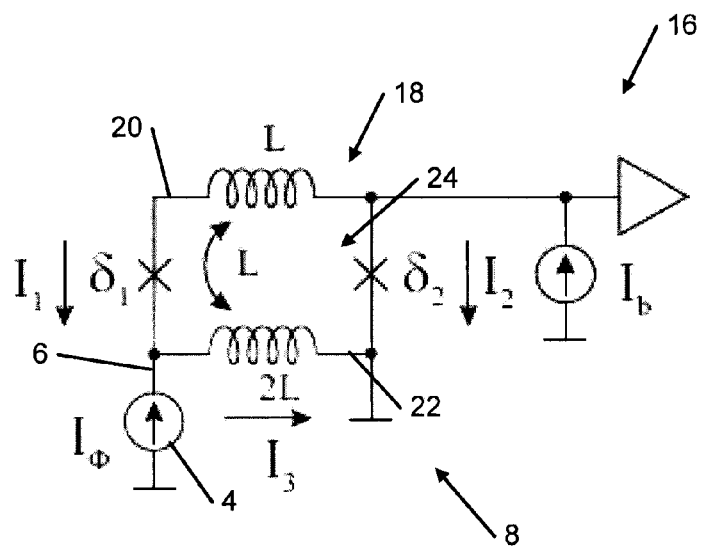
FIG. 2B is a circuit diagram of an amplifier system in accordance with the present invention.

Referring now to FIG. 2B, a circuit diagram is provided illustrating an amplifier system 16 that, in accordance with the present disclosure, includes a low-noise, phase-insensitive linear amplifier 8 capable of accommodating readout signals from quantum computing applications, even when such signals reach frequencies in the RF and microwave range. As shown in FIG. 2B, the amplifier device 8 includes a loop 18 formed from two superconducting traces 20, 22 separated by a thin dielectric layer 24. At an input 26, the loop 18 is connected to a transmission line environment 6. A signal source 4, which as described above, may be a quantum computing device or another source of high-frequency communication signals, such as those found in satellites or the like, injects a signal having an RF, microwave, or similar high-frequency signal directly into the transmission line environment and, thereby, directly to the amplifier 8.

It is contemplated that the amplifier 8 may have a general architecture referred to herein as a Superconducting Low-inductance Undulatory Galvanometer (SLUG). It is noted that the original work relating to superconducting low-inductance undulatory galvanometers (SLUGs) was focused on the creation of sensors by arranging a bead of PbSn solder frozen on a Nb wire to thereby measure currents passed along the Nb wire by way of currents measured between the two superconductors formed by the frozen solder. The current between the superconductors is periodic and changes therein can be readily measured or, the low inductance at the input to the sensor can be exploited to create a voltage sensor using substantially small resistances. As used herein, a SLUG-based amplifier refers to an architecture including the dielectric materials 24 (e.g., one or more thin film dielectric materials may be used) separating the superconducting layers 20, 22. By way of this architecture, the SLUG-based amplifier 8 achieves an extremely small effective area (for example, by using a thin dielectric layer to form the loop) and input coupling by direct current injection as opposed to flux coupling. As described above, the input to the SLUG-based amplifier is by direct current injection, as opposed to, for example, an inductive coupling found in a SQUID and other amplifier designs. In implementations where the amplifier device 8 is integrated into a microstrip transmission line, the amplifier device 8 can be realized in three metallization steps (corresponding to the circuit ground-plane and the two arms of the SLUG), with two dielectric thin films separating the metal layers. The mutual inductance between the arms of the amplifier device 8 is on the order of the self-inductance of the arms, and must be taken into account.

The total flux through the amplifier device 8 is shown in equation (9).

$$\Phi_T = L(I_1 + I_\Phi) + \Phi_b \quad (9)$$

$$= \frac{\Phi_0}{2\pi}(\delta_2 - \delta_1).$$

For the amplifier device 8, the dimensionless equations of motion for $\delta_{1,2}$ are shown in equation (10).

$$\beta_C \ddot{\delta}_1 = \frac{\delta_2 - \delta_1 - 2\pi\phi_b}{\pi\beta_L} - i_\phi - \sin\delta_1 - \dot{\delta}_1 + v_{N,1} \quad (10)$$

$$\beta_C \ddot{\delta}_2 = \frac{\delta_2 - \delta_1 - 2\pi\phi_b}{\pi\beta_L} + i_b + i_\phi - \sin\delta_2 - \dot{\delta}_2 + v_{N,2}$$

The output voltage and circulating current are given by equations (11) and (10), respectively.

$$v_{out} = \dot{\delta}_2 \quad (11)$$

$$j = \frac{1}{\pi\beta_L}(\delta_2 - \delta_1 - 2\pi\phi_b) - i_\phi/2. \quad (12)$$

To operate the SQUID-based amplifier described above with respect to FIG. 2B or the amplifier device 8 of FIG. 2B as an amplifier, $I_b$ and $\Phi_b$ are chosen to establish a quasistatic operating point where the transfer function $V\Phi \equiv \delta_V/\delta_\Phi$ is large.

In both cases, the device acts as a transimpedance element. That is, the signal from the signal source 4 is coupled to the device as a current, and the output signal is coupled from the device as a voltage.

DC Characteristic Analysis

In example implementations, equations (6) and (10) are numerically integrated using a 4th order Runge-Kutta solver for $N \sim 2^{18}$ time steps $\Delta\theta$ over a range of bias points.

Figure 3A:
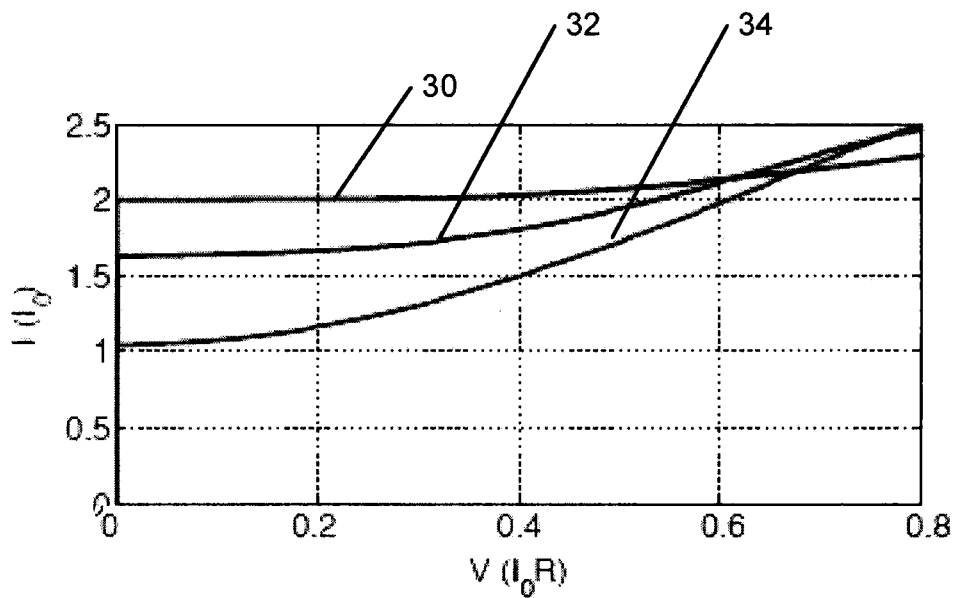
FIGS. 3A and 3B are graphs illustrating current-voltage (I-V) characteristics of the symmetric dc SQUID and the symmetric SLUG-based amplifier in accordance with the present invention, respectively.
Figure 3B:
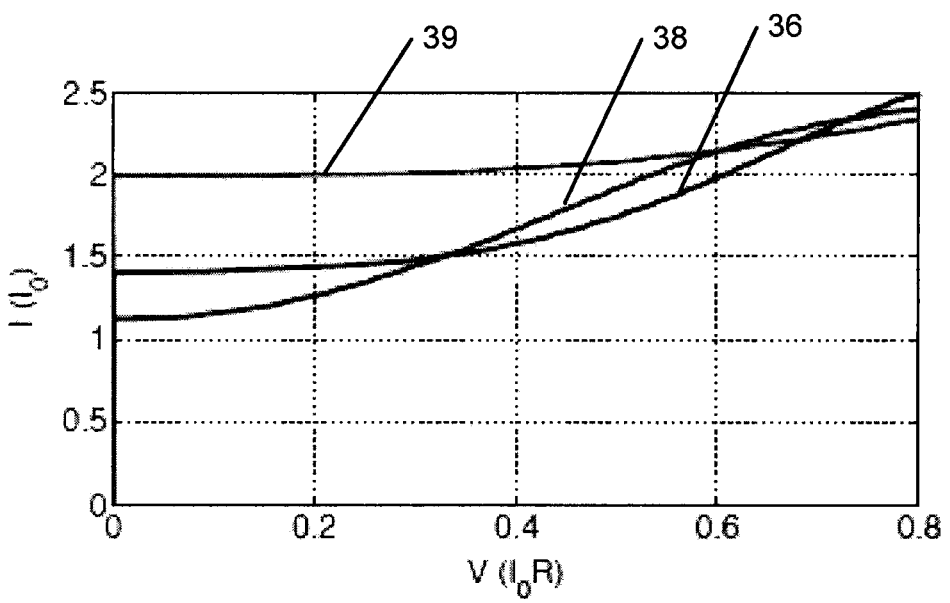

FIGS. 3A and 3B are graphs illustrating the current-voltage (I-V) characteristics of the symmetric dc SQUID and the symmetric SLUG with $\beta_L=1$ and $\beta_C=0.8$, respectively. In FIG. 3A, three lines are shown representing $\Phi_b=0\Phi_0$ (line 30), $\Phi_b=0.25\Phi_0$ (line 32), and $\Phi_b=0.5\Phi_0$ (line 34). In FIG. 3B, three lines are shown representing $\Phi_b=0\Phi_0$ (line 36), $\Phi_b=0.25\Phi_0$ (line 38), and $\Phi_b=0.5\Phi_0$ (line 39).

Figure 4A:
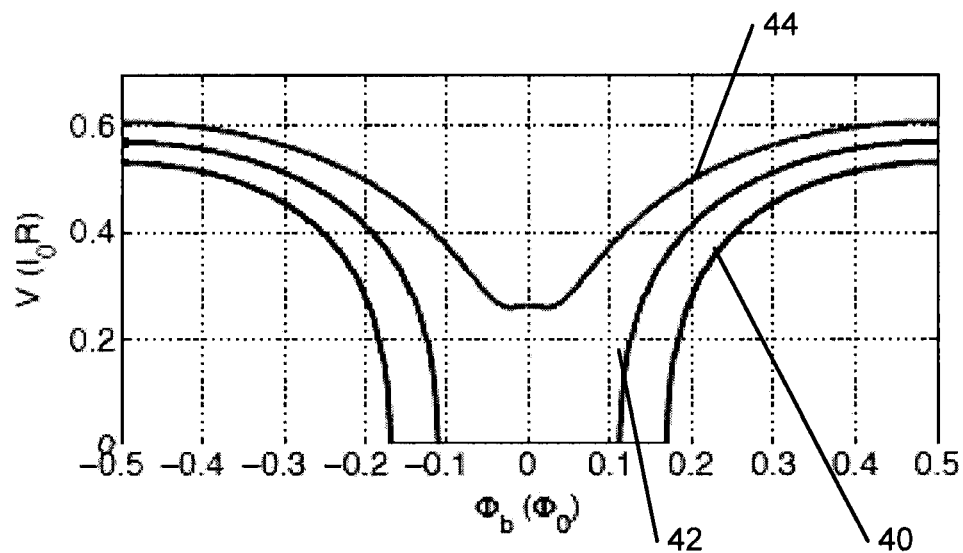
FIGS. 4A and 4B are graphs illustrating the V-$\Phi$ characteristics of the symmetric dc SQUID and the symmetric SLUG-based amplifier in accordance with the present invention, respectively.
Figure 4B:
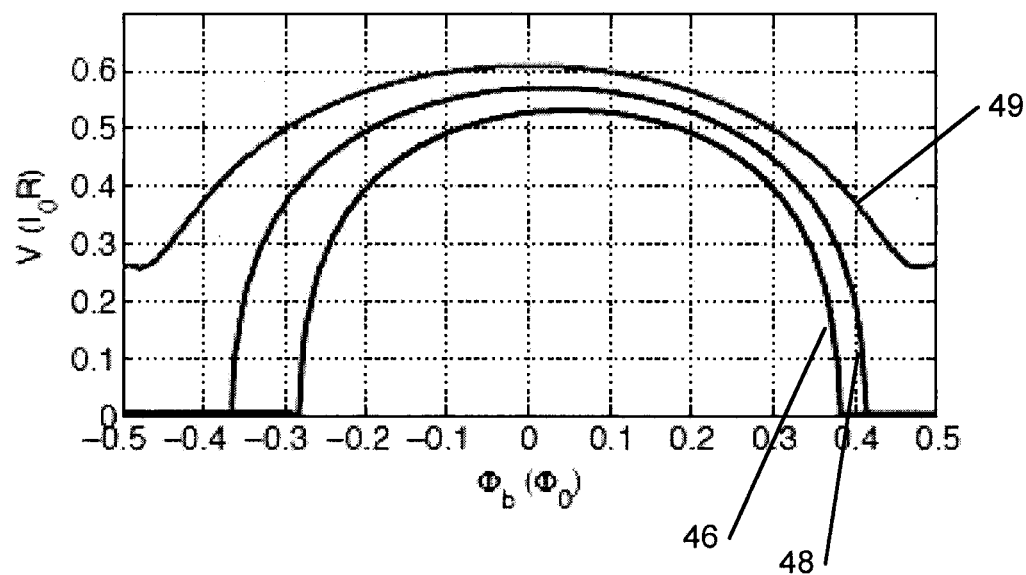

FIGS. 4A and 4B are graphs illustrating the V-$\Phi$ characteristics of the symmetric dc SQUID and the symmetric SLUG with $\beta_L=1$ and $\beta_C=0.8$, respectively. In FIG. 4A, three lines are shown representing $I_b=1.8I_0$ (line 40), $I_b=1.9 I_0$ (line 42), and $I_b=2.0 I_0$ (line 44). In FIG. 4B, three lines are shown representing $I_b=1.8 I_0$ (line 46), $I_b=1.9 I_0$ (line 48), and $I_b=2.0 I_0$ (line 49).

For bias near $1.9 I_0$, the peak-to-peak voltage modulation is somewhat above $0.5 I_0 R$. The dc characteristics of the SLUG amplifier closely match those of the symmetric dc SQUID, apart from a shift in flux bias point that arises from the asymmetric division of the bias current to the amplifier of the present invention. Similarly, the scattering parameters and noise properties of the amplifier of the present invention and the SQUID are closely matched, apart from this bias shift.

In the following analysis of amplifier devices created in accordance with the present invention, the following set of SLUG parameters are used: $\beta_L=1$, $\beta_C=0.8$, L=10 pH, and C=50 fF, corresponding to a junction with critical current 100 microamps ($\mu$A) and area around 1 micro square meter ($\mu m^2$). These device parameters are examples of appropriate parameters for working SLUG devices for at least the following reasons. First, in manufacturing such a device, inductances on the order of 10 pH are realized in a reliable, controlled way using the SLUG geometry, and the resulting device is generally less susceptible to stray reactances and is straightforward to model at microwave frequencies. The required critical current density is 10 kA/cm2, which can be provided using standard Nb—AlO$_x$—Nb technology. While Joule heating in the shunt resistors may be appreciable, the addition of large-volume normal-metal cooling fins can allow equilibration of the shunt resistors at temperatures below 100 mK. Lower device inductances may require uncomfortably high junction critical currents to achieve comparable device performance, and fabrication yield and Joule heating of the shunts could become less desirable. Alternatively, a significantly larger SLUG inductance can be used at the cost of providing less gain and complicating the microwave engineering, owing to the larger device dimensions.

Scattering Parameters

In order to optimize SLUG amplifier design in accordance with the present invention, it is useful to understand the forward transfer function and the complex input and output impedances of the device. To extract these from the present SLUG device model, appropriate test signals can be applied to the device or model, followed by probing of the complex response at the excitation frequency, chosen to be a small fraction of the Josephson frequency $\omega_J/2\pi$. The forward transimpedance $V_I \equiv \delta V/\delta I$ is readily derived from the SLUG flux-to-voltage transfer function $V\Phi$:

$$V_{I=M V \Phi'} \qquad (13)$$

In equation (13), M=L for the case of the symmetric SLUG.

Figure 5:
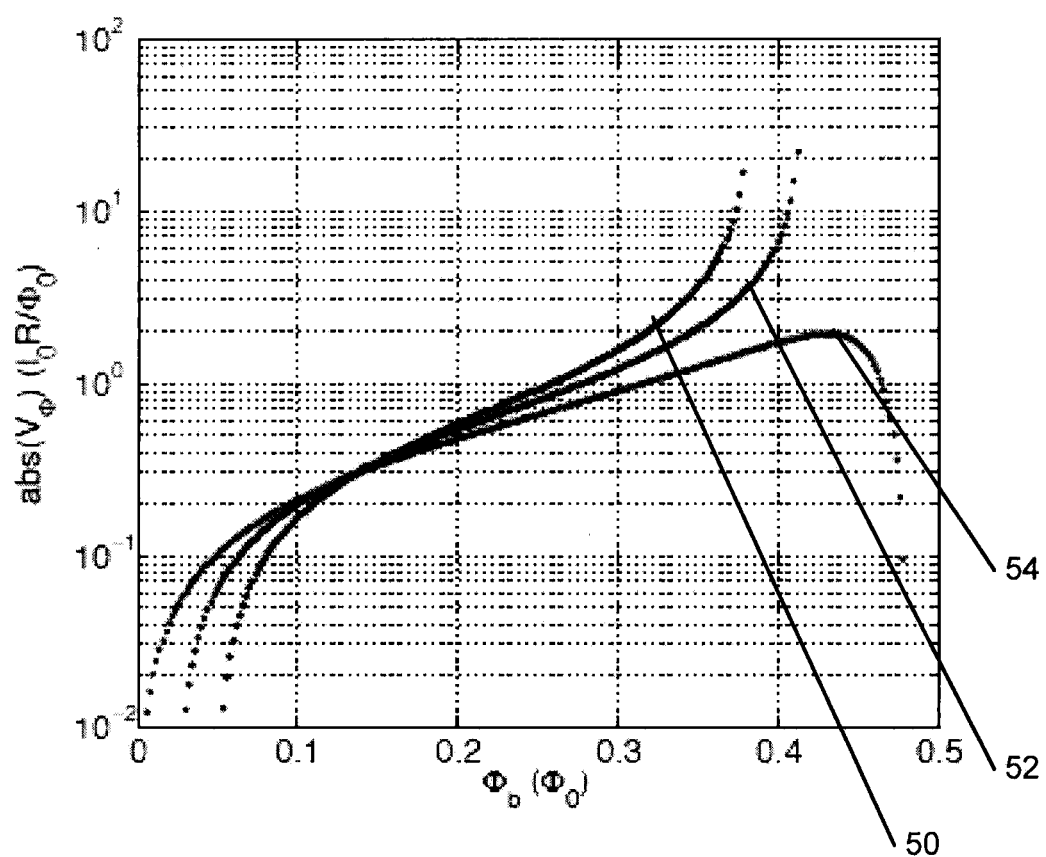
FIG. 5 is a graph illustrating $V_\Phi$ versus flux over a range of current bias points for a SLUG-based amplifier in accordance with the present invention.

FIG. 5 is a graph illustrating SLUG $V_\Phi$ versus flux over a range of current bias points for $\beta_L=1$ and $\beta_C=0.8$. In FIG. 5, three lines are shown representing $I_b=1.8\,I_0$ (line 50), $I_b=1.9\,I_0$ (line 52), and $I_b=2.0\,I_0$ (line 54).

Figure 6:
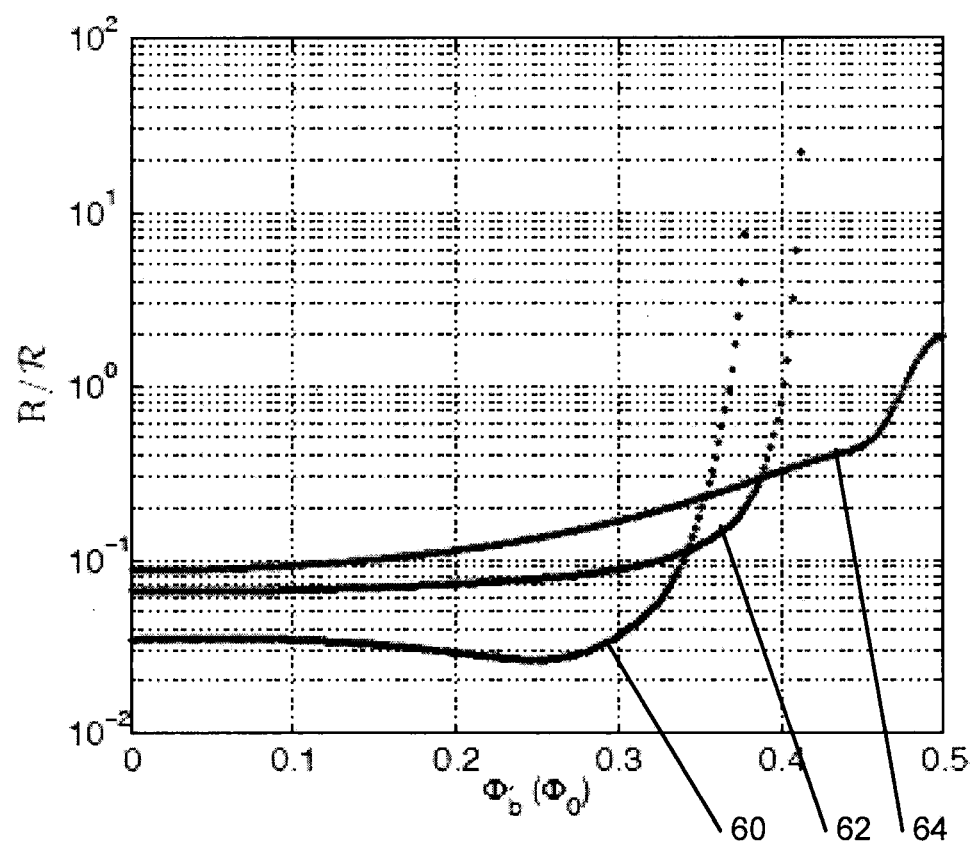
FIGS. 6 is a graph illustrating the relationship between $R/\mathcal{R}$ for a SLUG-based amplifier in accordance with the present invention over a range of bias points.
Figure 7:
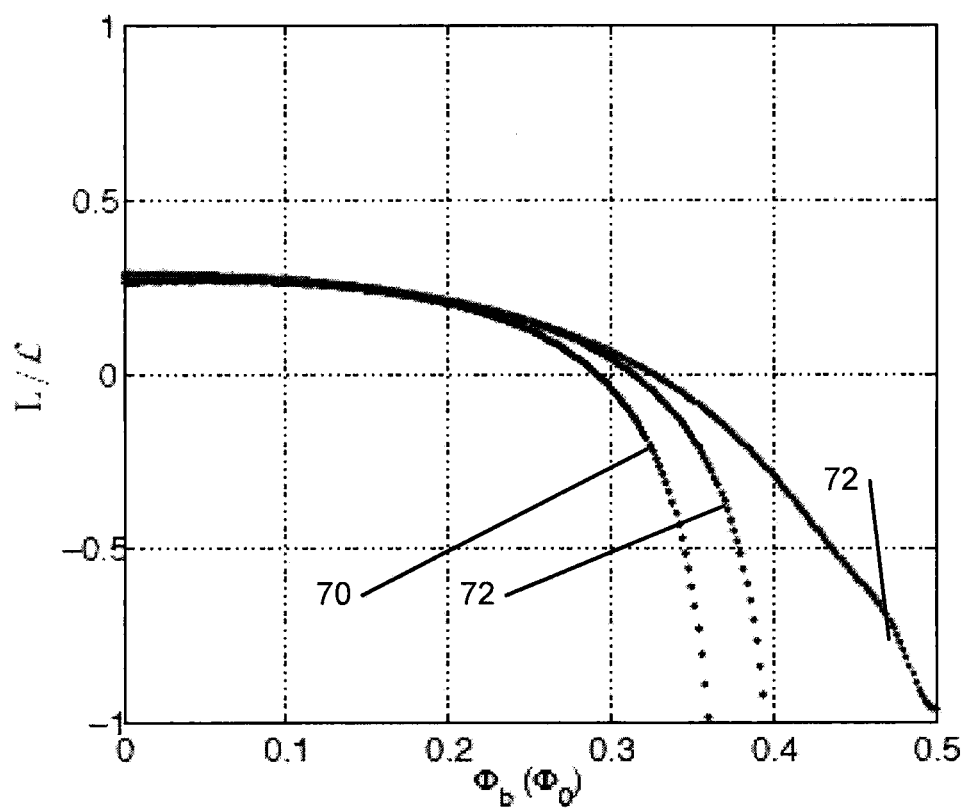
FIG. 7 is a graph illustrating the relationship between $L/\mathcal{L}$ for a SLUG-based amplifier in accordance with the present invention over a range of bias points.

Next, consider the input return loss. The SLUG input in accordance with the present invention is an inductive short to ground at low frequencies, and the complex input impedance $Z_i$ is frequency dependent. The input impedance is readily derived from the dynamic impedance Z, defined in terms of the flux-to-current transfer function $J_\Phi \equiv \delta J/\delta \Phi$, as shown in equation (14).

$$-J_\Phi \equiv \frac{1}{Z} = \frac{1}{\mathcal{L}} + \frac{j\omega}{\mathcal{R}}, \qquad (14)$$

where $\mathcal{R}$ is the frequency-independent dynamic resistance, while $\mathcal{L}$ is the dynamic inductance. FIGS. 6 and 7 are graphs illustrating the relationship between R/$\mathcal{R}$ and L/$\mathcal{L}$ respectively, for a SLUG device having $\beta_L=1$ and $\beta_C=0.8$ over a range of bias points. In FIG. 6, three lines are shown representing $I_b=1.8\,I_0$ (line 60), $I_b=1.9\,I_0$ (line 62), and $I_b=2.0\,I_0$ (line 64). In FIG. 7, three lines are shown representing $I_b=1.8\,I_0$ (line 70), $I_b=1.9\,I_0$ (line 72), and $I_b=2.0\,I_0$ (line 74).

Figure 8:
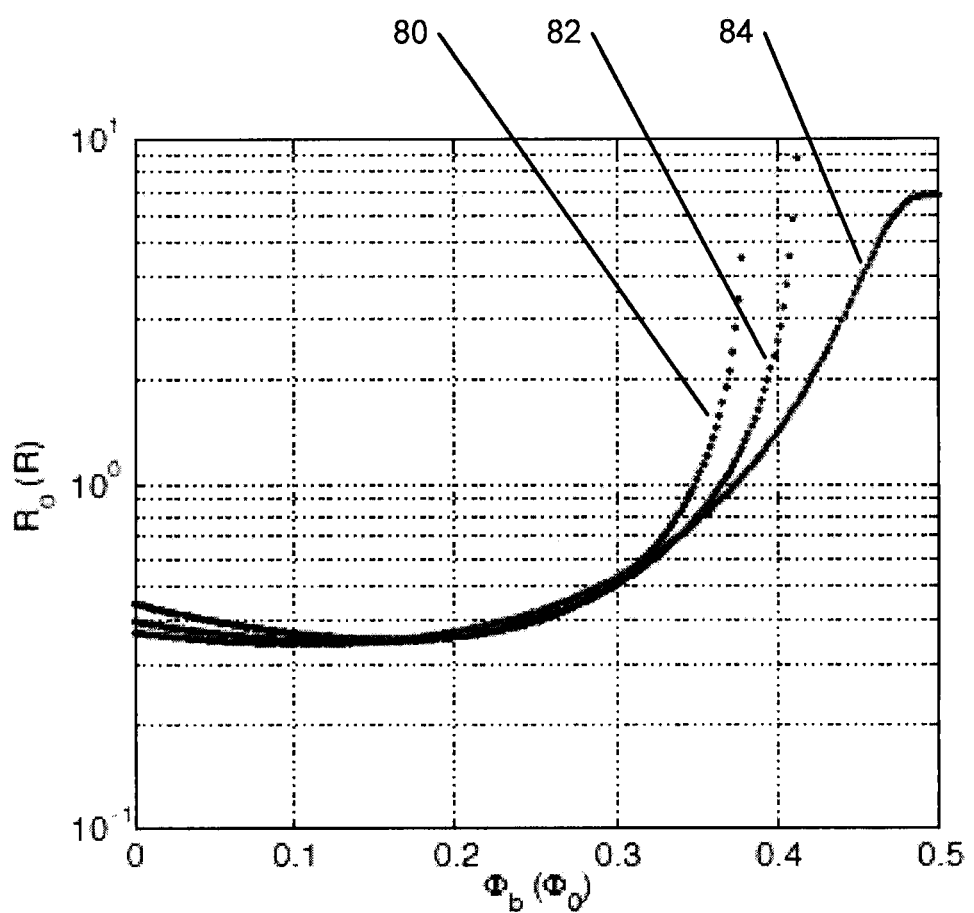
FIG. 8 is a graph illustrating the output impedance $R_O$ of a SLUG-based amplifier in accordance with the present invention over a range of bias points.

FIG. 8 is a graph illustrating the SLUG device output impedance $R_O$ over a range of bias points. In FIG. 8, three lines are shown representing $I_b=1.8\,I_0$ (line 80), $I_b=1.9\,I_0$ (line 82), and $I_b=2.0\,I_0$ (line 84).

The output impedance of the SLUG device is real and frequency independent, and the magnitude of $R_O$ is on the order of the junction shunt resistance R.

For the following discussion, it is convenient to work in terms of the bias-dependent dimensionless impedance parameters $\rho_{i,o}$, defined by equation (15).

$$R_i = \rho_i \frac{(\omega M)^2}{R} \qquad (15)$$

$$R_0 = \rho_0 R$$

From the definition of $\mathcal{R}$ above, it follows that $\rho_i = R/\mathcal{R}$. Amplifier gain, bandwidth, and noise properties depend sensitively on $p_i$ and $p_o$.

Power gain of the SLUG device, in one implementation, is maximized when appropriate conjugate matching networks are employed to couple the signal to and from the device. The maximum available power gain $G_m$ is provided by equation (16).

$$G_M = \frac{V_0^2/4R_0}{I_i^2 R_i}. \qquad (16)$$

In equation (16), $I_i$ is the input current and $V_o$ is the output voltage.

Using equation (15), equation (17) follows:

$$G_M = \frac{1}{4\rho_i \rho_0} \left(\frac{V_\Phi}{\omega}\right)^2. \qquad (17)$$

Figure 9:
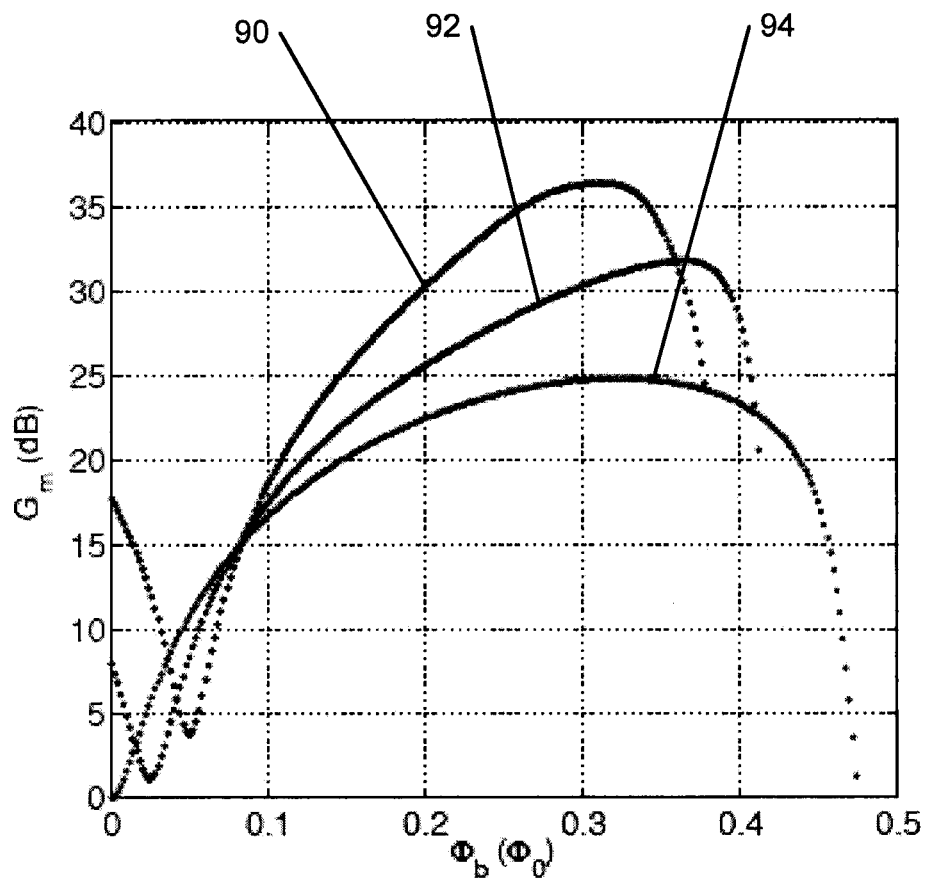
FIG. 9 is a graph illustrating power gain $G_m$ versus flux for various bias current $I_b$ for the symmetric SLUG-based amplifier in accordance with the present invention for an operating frequency of 5 GHz.

FIG. 9 is a graph illustrating power gain $G_m$ versus flux for various bias current $I_b$ for the symmetric SLUG device with $\beta_L=1$, $\beta_C=0.8$, L=10 pH, and C=50 fF for an operating frequency in excess of 5 GHz. In FIG. 9, three lines are shown representing $I_b=1.8\,I_0$ (line 90), $I_b=1.9\,I_0$ (line 92), and $I_b=2.0\,I_0$ (line 94). Over a broad range of bias parameters, gain in excess of 20 dB is achievable. It is important to note, however, that a conjugate match to a 50Ω source does not readily yield best amplifier noise performance, due to the mismatch between the real part of the SLUG input impedance $R_i$ and the optimal noise-matched source impedance, which can be significantly larger than $R_i$. Amplifier optimization therefore involves a trade-off between gain and noise performance, as discussed in detail below.

The bandwidth of the SLUG amplifier will be determined by the coupling to the low-impedance input port, as the device output is reasonably well-matched to typical transmission line impedances. In the following discussion, to generate an estimate of amplifier bandwidth, a 50Ω source impedance is considered. However, such discussion will illustrate that other similar source impedances can be accommodated. It is assumed that conjugate matching at the SLUG device input is accomplished via a quarter-wave transmission line section. For discussion purposes, the present disclosure neglects the imaginary part of the SLUG input impedance. The amplifier quality factor Q in that case is given by equation (18).

$$Q \approx \frac{\pi}{8}\sqrt{\frac{50\Omega}{R_i}} = \frac{\pi}{8\omega M}\sqrt{\frac{50\Omega \times R}{\rho_i}}. \qquad (18)$$

The bandwidth of an amplifier designed at an operating frequency $\omega/2\pi$ is then $\omega/2\pi Q$. For an operating frequency around 5 GHz, $R_i$ is on the order of 0.1Ω. Therefore Q is expected to be on the order of 10, and amplifier bandwidths on the order of hundreds of MHz. For current bias $I_b < 2I_0$ and for a narrow range of fluxes corresponding to bias points near the supercurrent branch, it is possible to achieve extremely high power gain (see, for example, FIG. 9). However, the high gains achieved at these bias points are due largely to vanishing $R_i$ 13 an amplifier designed to operate in this regime would have a rather small bandwidth. It is important to note that equation (18) presents only a rough guideline for the bandwidth rather than a fundamental limit. In particular, it is possible to obtain a larger bandwidth with less or no degradation in gain by employing either a tapered transmission line matching section or a multisection input transformer with stepped transmission line impedances.

Noise Properties in the Thermal Regime

The Johnson noise of the shunt resistors gives rise to a voltage noise at the device output and to a circulating current noise in the device loop; moreover, these noises are partially correlated, since the circulating current noise couples a flux noise to the loop, which in turn yields a voltage noise across the device. To incorporate noise in the present model, a pseudorandom number generator can be used to create a gaussian-distributed set of voltages $v_{N,1}$ and $v_{N,2}$ with zero mean and variance $2\Gamma/\Delta\theta$, with the dimensionless noise parameter $\Gamma=2\pi k_B T/I_0\Phi_0$, corresponding to the usual white power spectral density $S_v=4\Gamma$ for Johnson noise in the thermal limit. The simulations were averaged over many (~100) realizations of the random noise voltages.

The dimensionless noise parameters $y_V$, $y_J$, and $y_{VJ}$, such that the voltage noise spectral density at the device output is given by $S_V=2y_V k_B TR$, the circulating current noise spectral density is $SJ=2y_J k_B T/R$, and the cross noise spectral density is $S_{VJ}=2y_{VJ} k_B T$; here T is the electron temperature of the shunt resistors. These noises are calculated by solving the Langevin equations (10).

The noise spectrum consists of a series of peaks at the Josephson frequency and its harmonics; the dimensionless noises are evaluated at low frequency $f<<\omega_J/2\pi$ where the spectrum is white. The noises y do depend on the noise parameter $\Gamma$, due to the possibility of saturation and smearing of the device characteristics at elevated temperature.

Figure 10A:
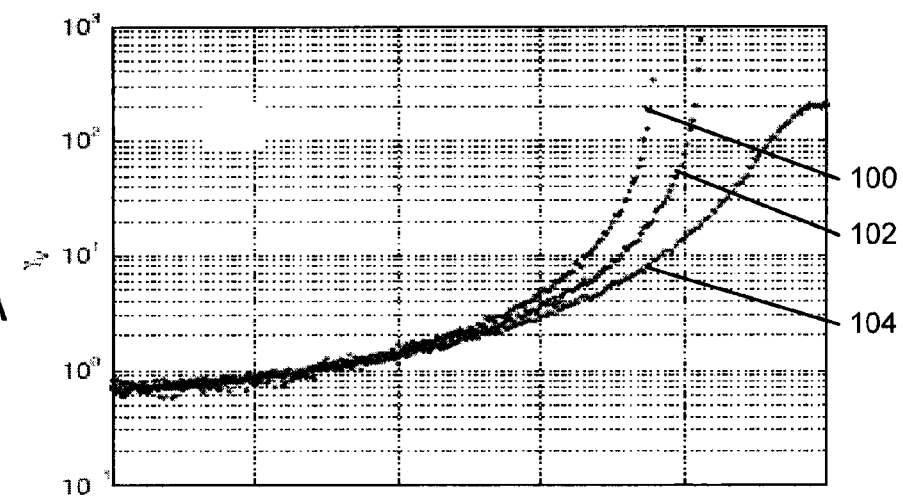
FIGS. 10A-10C are graphs illustrating the noises $y_V$, $y_J$, and $y_{VJ}$, respectively, over a range of bias parameters of the symmetric SLUG-based amplifier in accordance with the present invention.
Figure 10B:
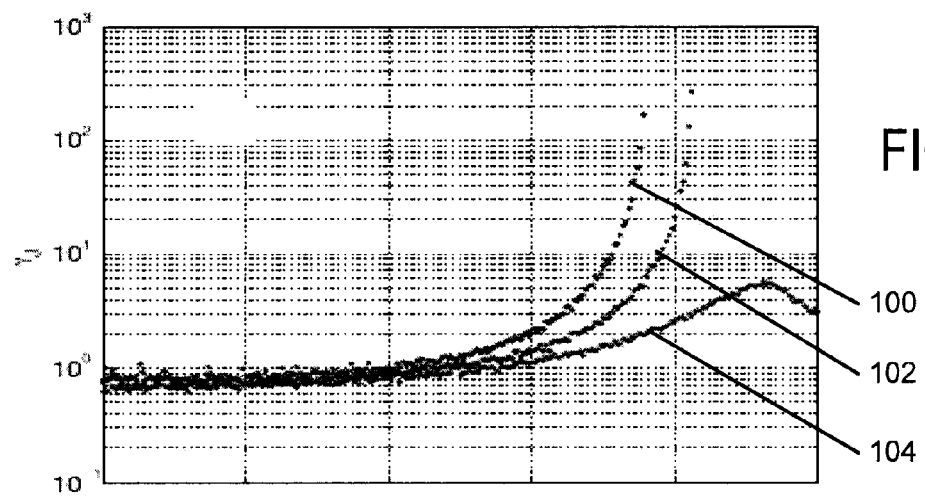
Figure 10C:
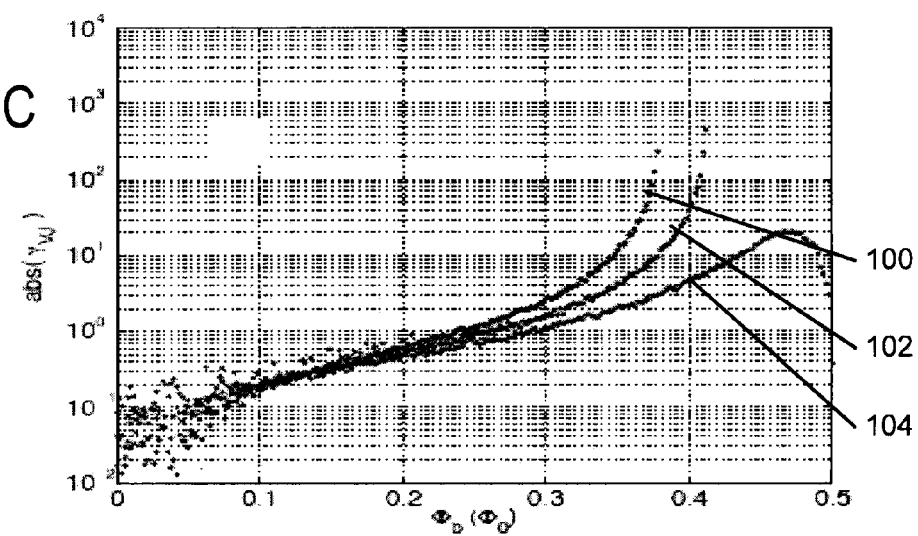

FIGS. 10A-10C are graphs illustrating the dimensionless noises $y_V$, $y_J$, and $y_{VJ}$, respectively, over a range of bias parameters of the symmetric SLUG device for device parameters $\beta_L=1$, $\oplus_C=0.8$, and $\Gamma=4\times10^{-5}$; this choice corresponds to a temperature of 100 mK for a junction critical current of 100 μA. In FIGS. 10A-10C, for each graph, three lines are shown representing $I_b=1.8\ I_0$ (line 100), $I_b=1.9\ I_0$ (line 102), and $I_b=2.0\ I_0$ (line 104). At high bias current $I_b>>I_0$, $y_{V,J}$ approaches the expected Johnson noise limit of 1 (one) for the two shunt resistors in parallel.

Figure 11:
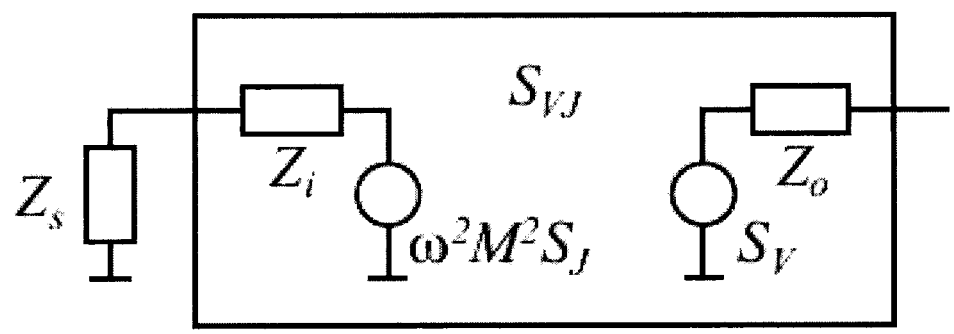
FIG. 11 is a simplified circuit diagram of the SLUG-based amplifier in accordance with the present invention for purposes of evaluating device noise temperature $T_n$.

The device noise temperature $T_n$ can be evaluated from the circuit shown in FIG. 11. There it is assumed a noiseless source impedance $Z_s=R_s+jX_s$ and equate the total noise of the amplifier to the noise contribution from a source resistance $R_s$ at an effective temperature $T_n$. All noises are referred to the device output. This results in equation (19).

$$4k_B T_n R_s \frac{V_\Phi^2 M^2}{R_t^2 + X_t^2} = \quad (19)$$

$$2\gamma_V k_B TR + \frac{2\gamma_J k_B T}{R}\frac{\omega^2 V_\Phi^2 M^4}{R_t^2 + X_t^2} + 4\gamma_{VJ} k_B T \frac{\omega V_\Phi M^2 X_t}{R_t^2 + X_t^2}.$$

In equation (19) $R_t=R_s+R_i (X_t=X_s+X_i)$ is the sum of the real (imaginary) parts of the source impedance and the device input impedance. The noise temperature is thus given by equation (20).

$$T_n = \left[\frac{\gamma_V}{2}\frac{(R_t^2 + X_t^2)R}{V_\Phi^2 M^2 R_S} + \frac{\gamma_J}{2}\frac{(\omega^2 M^2)}{RR_S} + \gamma_{VJ}\frac{\omega X_t}{V_\Phi R_S}\right]T. \quad (20)$$

The condition $\delta T_n/\delta X_s=0$ is used to solve for the imaginary part of the optimal source impedance, as shown in equation (21).

$$X_{s,opt} = -\frac{\gamma_{VJ}}{\gamma_V}\frac{\omega V_\Phi M^2}{R} - X_i, \quad (21)$$

Similarly, the condition $\delta T_n/\delta R_s=0$ yields the real part of the optimal source impedance as shown in equation (22).

$$R_{s,opt} = \left[1 + \frac{1}{\gamma_V^2 \rho_i^2}\left(\frac{V_\Phi}{\omega}\right)^2 (\gamma_V \gamma_J - \gamma_{VJ}^2)\right]^{1/2} R_i. \quad (22)$$

For bias points where $V_\Phi$ is highest, equation (23) shows an approximate expression for $R_{s,opt}$.

$$R_{s,opt} \approx \frac{1}{\gamma_V \rho_i}\frac{V_\Phi}{\omega}(\gamma_V \gamma_J - \gamma_{VJ}^2)^{\frac{1}{2}} R_i = \frac{\omega V_\Phi M^2}{\gamma_V R}(\gamma_V \gamma_J - \gamma_{VJ}^2)^{1/2}. \quad (23)$$

Figure 12:
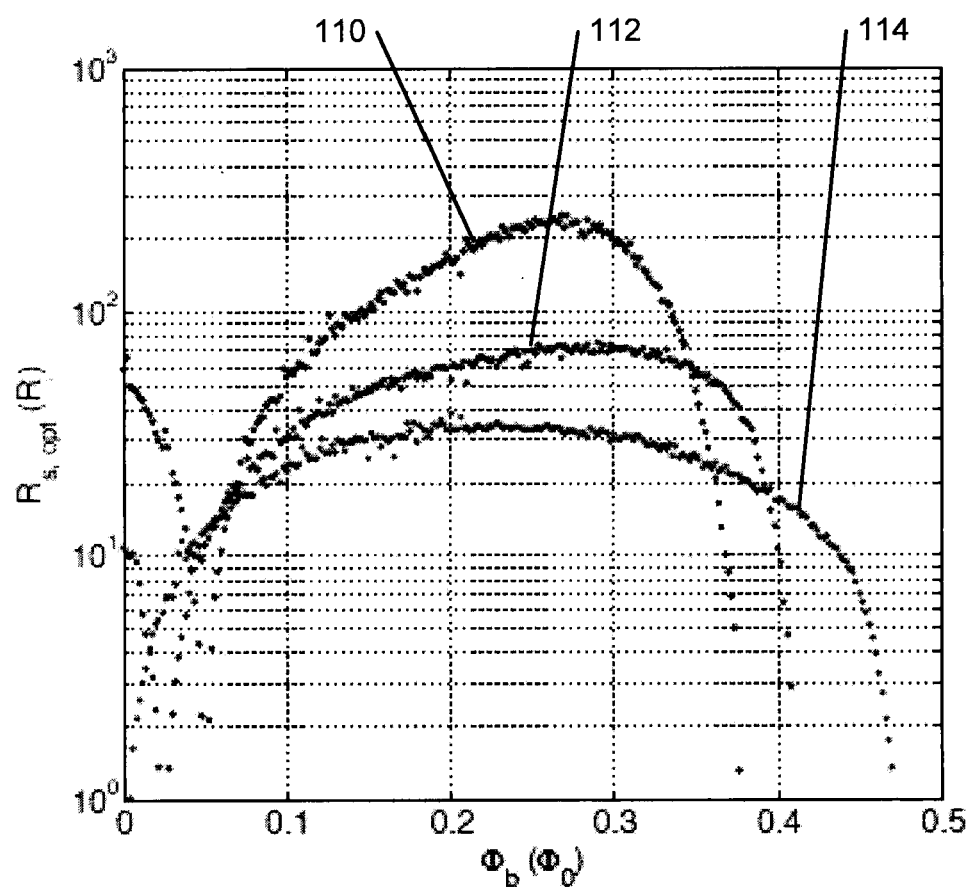
FIG. 12 is a graph illustrating a plot of $R_{s,opt}/R_i$ versus flux for various bias currents of the SLUG-based amplifier in accordance with the present invention.

FIG. 12 is a graph illustrating a plot of $R_{s,opt}/R_i$ versus flux for various bias currents. In FIG. 12, three lines are shown representing $I_b=1.8\ I_0$ (line 110), $I_b=1.9\ I_0$ (line 112), and $I_b=2.0\ I_0$ (line 114).

For typical device parameters, $R_{s,opt}>>R_i$. For this reason, it can be difficult to achieve a simultaneous power match and noise match. It is worthwhile to note, however, that the ratio $R_{s,opt}/R_i$ scales with frequency as $\omega^{-1}$, facilitating simultaneous attainment of high gain and good noise performance at higher operating frequencies.

When the signal is coupled to the device via a source with optimal impedance $R_{s,opt}+jX_{s,opt}$, the amplifier noise temperature becomes:

$$T_{n,opt} = \frac{\omega}{V_\Phi}(\gamma_V \gamma_J - \gamma_{VJ}^2)^{1/2} T. \quad (24)$$

Figure 13:
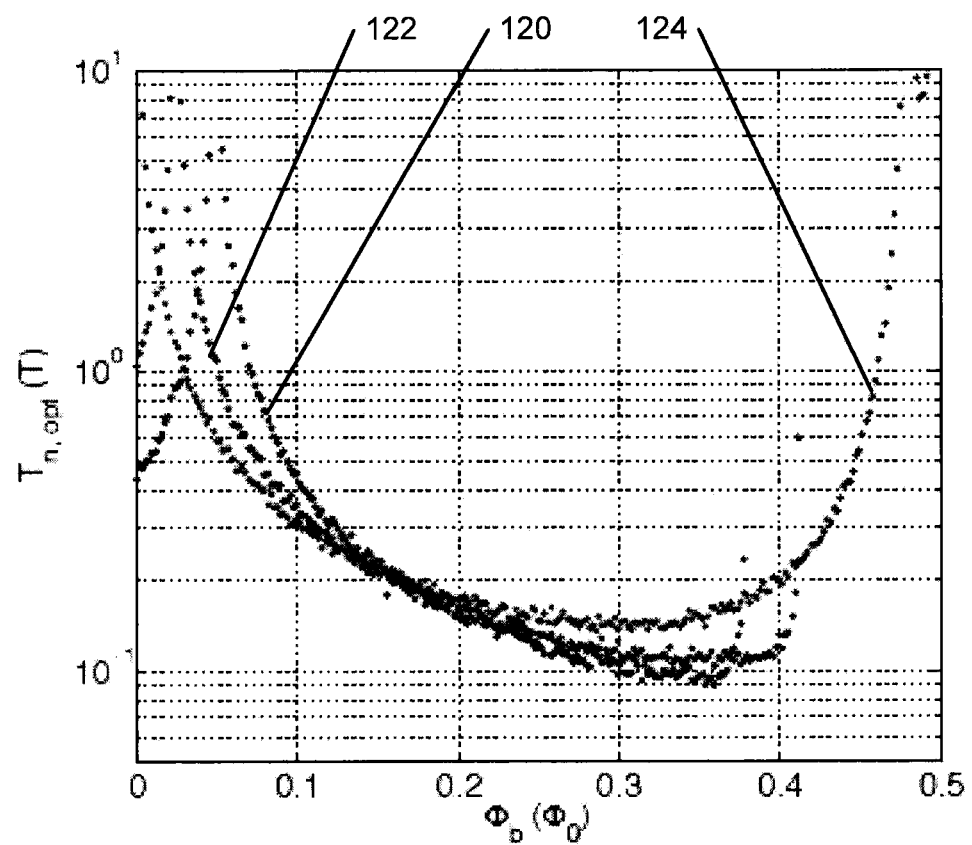
FIG. 13 is a graph illustrating optimal noise temperature $T_{n,opt}$ versus flux for various bias currents $I_b$ for a SLUG-based amplifier in accordance with the present invention at an operating frequency $\omega/2\pi=5$ GHz.

FIG. 13 is a graph illustrating optimal noise temperature $T_{n,opt}$ versus flux for various bias currents $I_b$ for a SLUG amplifier at an operating frequency $\omega/2\pi=5$ GHz. In FIG. 12, three lines are shown representing $I_b=1.8\ I_0$ (line 120), $I_b=1.9\ I_0$ (line 122), and $I_b=2.0\ I_0$ (line 124). Note that every point in these plots corresponds to a different realization of the input matching network.

Noise Properties in the Quantum Regime

At sufficiently low temperature, the zero-point fluctuations of the resistive shunts are expected to make the dominant noise contribution. The full expression for the spectral density of voltage noise produced by the resistors is written as 2hfR-coth(hf/2$k_B$T). The added noise of the symmetric SLUG in the zero-temperature limit, where the voltage spectral density of the shunt resistors becomes 2hfR. A single-sided quantum spectral density can be calculated by digitally filtering gaussian white noise. Using the quantum noise as a driving term in the Langevin equations (10), the voltage power spectral density $S_V(f)$ at the device output, the circulating current spectral density $S_J(f)$, and the cross spectral density $S_{VJ}(f)$ are evaluated.

Figure 14A:
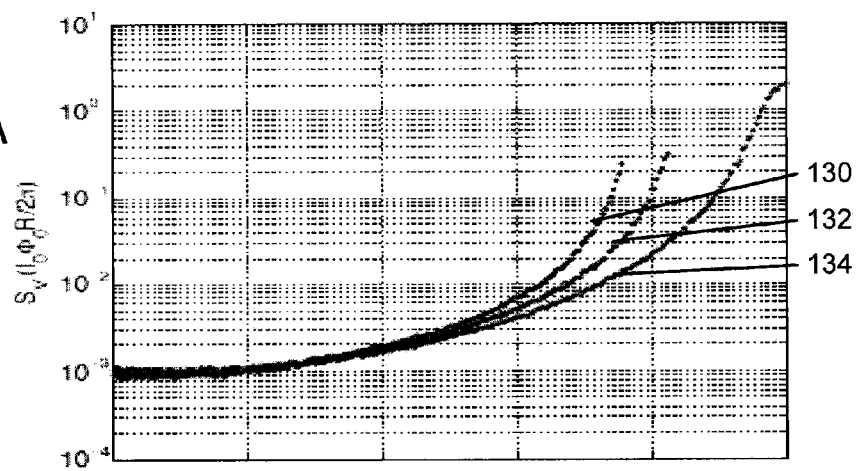
FIGS. 14A-14C are graphs illustrating plots of the quantum noises for $S_V$, $S_J$, and $S_{VJ}$, respectively, versus flux for a number of bias currents $I_b$ used with a SLUG-based amplifier in accordance with the present invention.
Figure 14B:
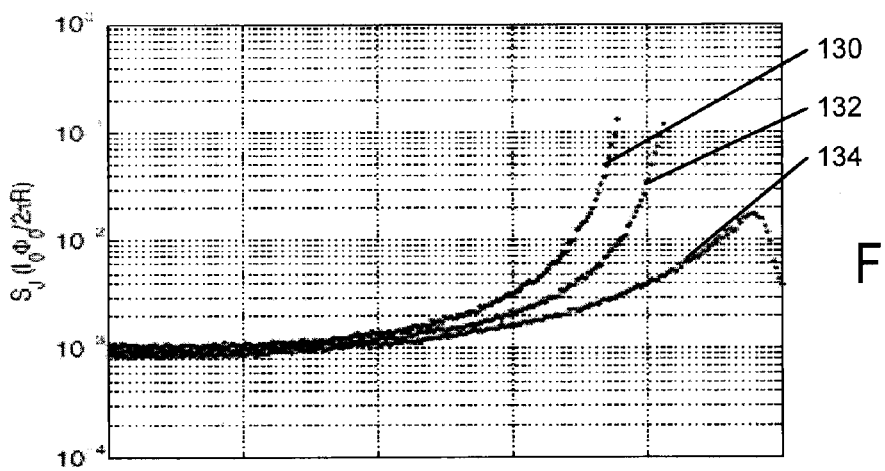
Figure 14C:
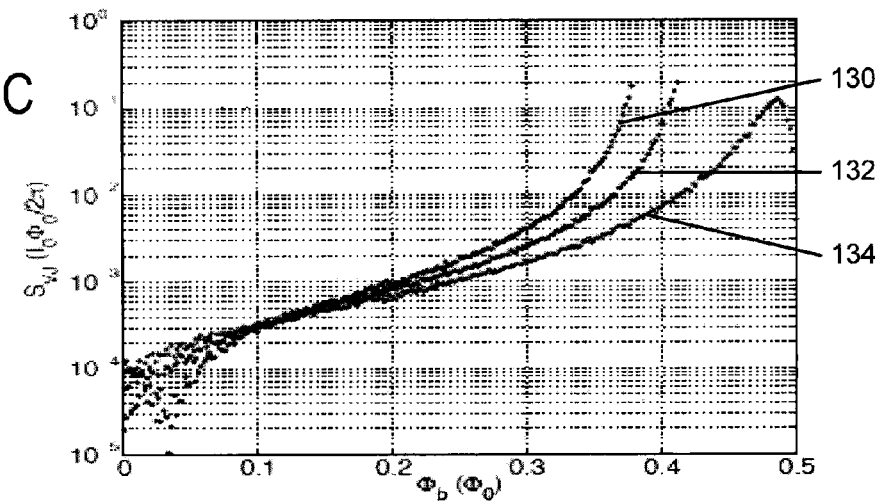

FIGS. 14A-14C are graphs illustrating plots of the quantum noises for $S_V$, $S_J$, and $S_{VJ}$, respectively, versus flux for a number of bias currents $I_b$. In FIGS. 14A-14C, for each graph, three lines are shown representing $I_b=1.8\,I_0$ (line 130), $I_b=1.9\,I_0$ (line 132), and $I_b=2.0\,I_0$ (line 134). Once again, the device noise temperature $T_n$ can be evaluated from the circuit of FIG. 11. A zero-temperature source impedance $Zs=Rs+jXs$ is assumed and the total noise of the amplifier is equated to the noise contribution from a source resistance $R_S$ at a finite effective temperature $T_n$. The amplifier noise temperature is obtained from equation (25).

$$2hfR_S\coth(hf/2k_BT_n)\frac{V_\Phi^2 M^2}{R_t^2+X_t^2} = \quad (25)$$
$$S_V + S_J\frac{\omega^2 V_\Phi^2 M^4}{R_t^2+X_t^2} + 2S_{VJ}\frac{\omega V_\Phi M^2 X_t}{R_t^2+X_t^2} + 2hfR_S\frac{V_\Phi^2 M^2}{R_t^2+X_t^2}.$$

Alternatively, it is possible to express the noise contribution of the device in terms of an added number of noise photons n, where n and $T_n$ are related as shown in equation (26).

$$\coth(hf/2k_BT_n) = 2n+1 \quad (26)$$

In accordance with equation (26), equation (27) is determined.

$$n = \frac{1}{2hfR_S}\left[\frac{S_V}{2}\frac{R_t^2+X_t^2}{V_\Phi^2 M^2} + \frac{S_J}{2}\omega^2 M^2 + S_{VJ}\frac{\omega}{V_\Phi}X_t\right] \quad (27)$$

The optimal source impedance $Z_{s,opt}=R_{s,opt}+jX_{s,opt}$ is obtained from the relations $\delta_n/\delta X_t=0$ and $\delta_n/\delta R_S=0$. The imaginary part of the optimal source impedance is given by equation (28).

$$X_{s,opt} = -\frac{S_{VJ}}{S_V}\omega V_\Phi M^2 - x_i \quad (28)$$

Similarly, the real part of the optimal source impedance is shown by equation (29).

$$R_{s,opt} = \left[1+\left(\frac{V_\Phi R}{\rho_i\omega S_V}\right)^2(S_V S_J - S_{VJ}^2)\right]^{1/2} R_i. \quad (29)$$

In the limit $V_\Phi \gg \omega$, equation (30) follows.

$$R_{s,opt} \approx \frac{\omega V_\Phi M^2}{S_V}(S_V S_J - S_{VJ}^2)^{1/2} \quad (30)$$

Figure 15:
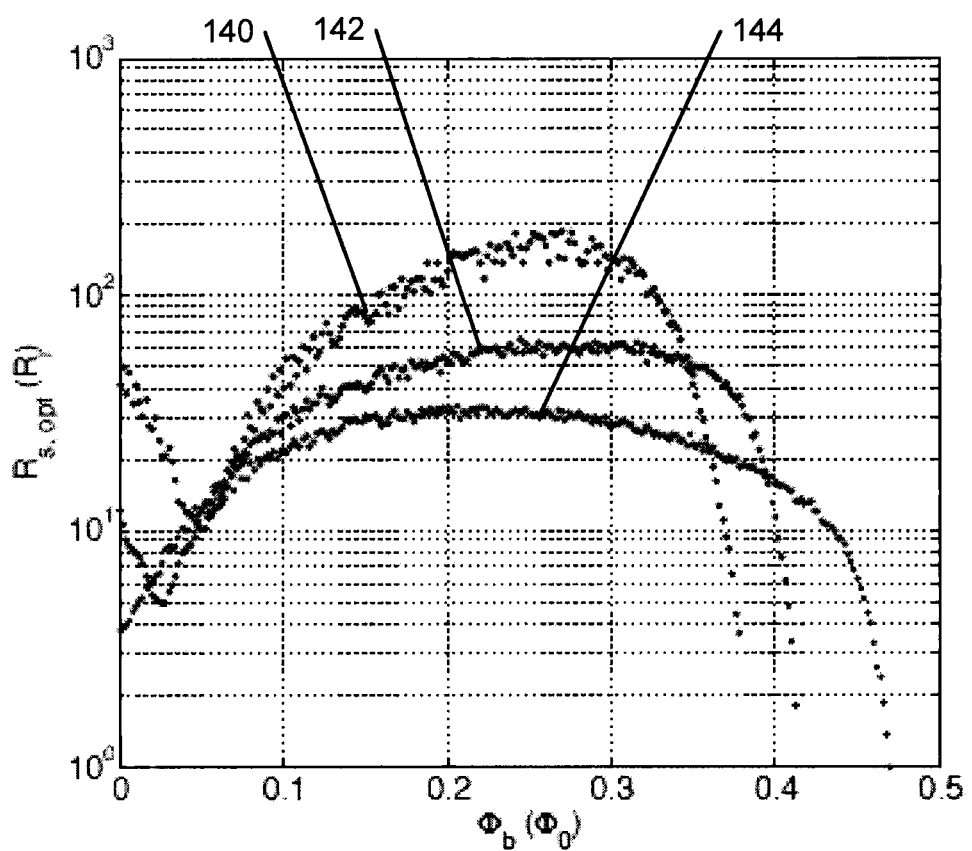
FIG. 15 is a graph illustrating $R_{s,opt}/R_i$ in the quantum regime versus flux for a range of bias $I_b$ used with a SLUG-based amplifier in accordance with the present invention.

FIG. 15 is a graph illustrating $R_{s,opt}/R_i$ in the quantum regime versus flux for a range of bias $I_b$. In FIG. 14, three lines are shown representing $I_b=1.8\,I_0$ (line 140), $I_b=1.9\,I_0$ (line 142), and $I_b=2.0\,I_0$ (line 144). FIG. 15 depicts impedance at any operating frequency of 5 Ghz with SLUG device parameters of $\beta_L=1$, $\beta_C=0.8$, L=10 pH, and C=50 fF.

For the optimally matched source, the added number of noise photons is given by equation (31).

$$n_{opt} = \frac{1}{2hV_\Phi}(S_V S_J - S_{VJ}^2)^{1/2} \quad (31)$$

Figure 16:
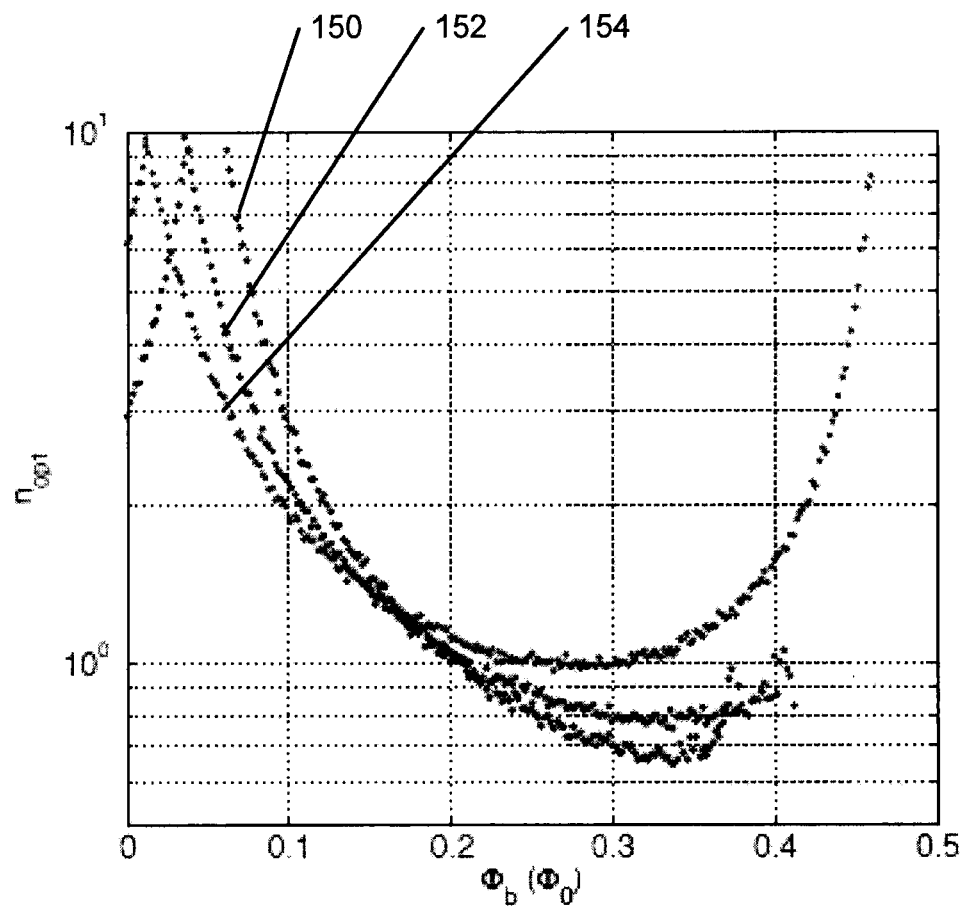
FIG. 16 is a graph illustrating $n_{opt}$ versus flux for a variety of matched current sources at an operating frequency of 5 Ghz used with a SLUG-based amplifier in accordance with the present invention.

FIG. 16 is a graph illustrating $n_{opt}$ versus flux for a variety of matched current sources at an operating frequency of 5 GHz, with SLUG device parameters of $\beta_L=1$, $\beta_C=0.8$, L=10 pH, and C=50 fF. In FIG. 16, three lines are shown representing $I_b=1.8\,I_0$ (line 150), $I_b=1.9\,I_0$ (line 152), and $I_b=2.0\,I_0$ (line 154). As shown by FIG. 15, for an appropriately noise-matched source, the SLUG approaches a noise level that is close to the standard quantum limit $n_{SQL}=\frac{1}{2}$, a minimum achievable added noise for a phase-insensitive linear amplifier.

Amplifier Design Using Analysis Constraints

As shown by the above analysis, the above-described SLUG-based amplifier design is an attractive gain element for the realization of a low-noise, high-frequency, such as RF or microwave frequency, amplification. In the present system, the SLUG device can be incorporated into transmission line environments, such as existing, external networks used to embed the device in a 50Ω environment. In doing so, the design is configured to deliver desirable power transfer to and from the device and to substantially match the impedance (e.g., 50Ω) of the source to the desired noise impedance at the desired operating frequency.

Figure 17A:
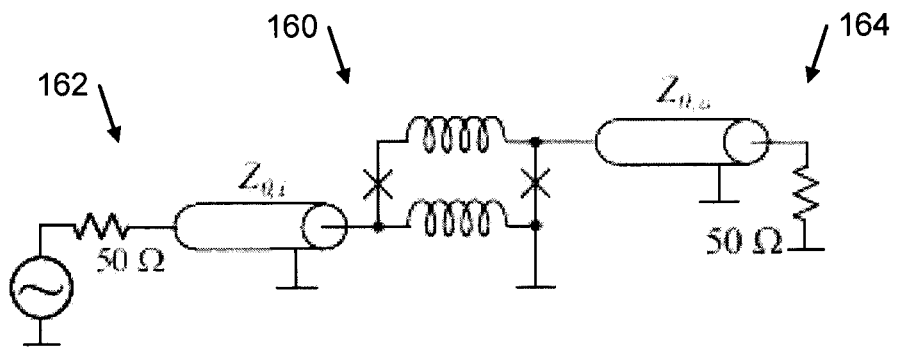
FIG. 17A is a schematic diagram illustrating a SLUG-based high-frequency amplifier with transmission line matching sections at the input and output.

For example, to maximize gain, a conjugate matching network may be designed to transform the 50Ω source to $R_i$-$jX_j$. On the other hand, optimal noise performance may be achieved for an input matching network that transforms the 50 Ω generator to the complex optimal source impedance $Z_{s,opt}=R_{s,opt}+jX_{s,opt}$. Because $R_{s,opt} \gg R_i$ for typical parameters, it is generally difficult to achieve a simultaneous power match and noise match. However, it can be possible to find a compromise where there is reasonable gain and good noise performance over a relatively broad bias range. FIG. 17A is a schematic diagram showing a SLUG-based high-frequency amplifier 160 with transmission line matching sections at the input 162 and output 164.

Figure 17B:
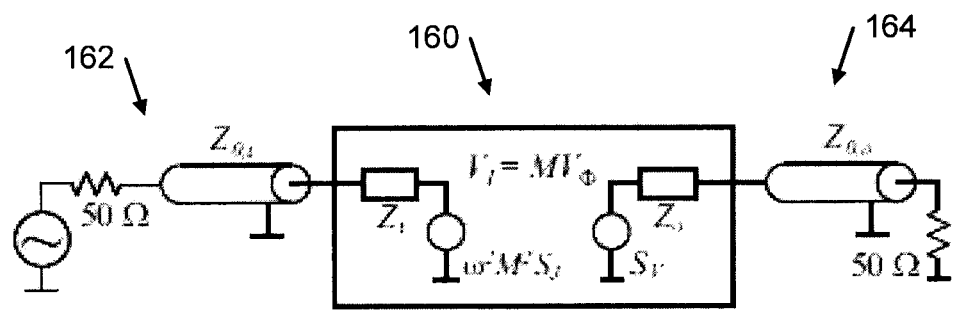
FIG. 17B is a schematic diagram illustrating a black box SLUG-based amplifier for use in amplifier analysis.

To calculate amplifier gain and noise performance, the SLUG-based amplifier 160 is treated as a "black box" with scattering and noise parameters derived from the calculations described above. FIG. 17B is a schematic diagram showing the black box SLUG-based amplifier 160 for use in amplifier analysis.

Figure 18A:
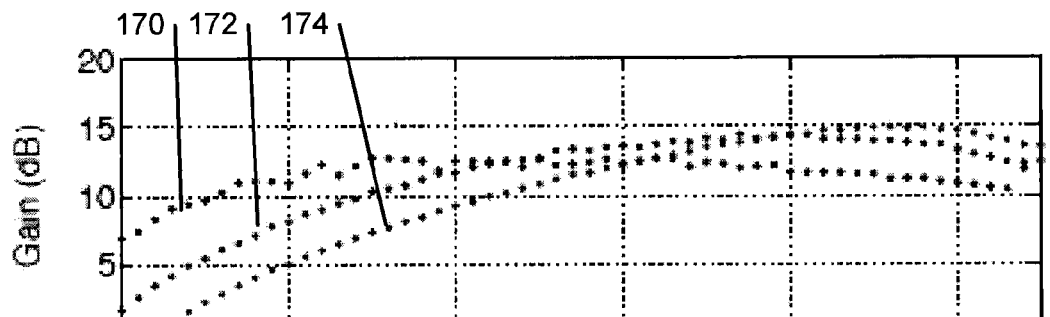
FIGS. 18A-18C are graphs illustrating frequency-dependent gain, noise temperature $T_n$, and added noise quanta n for SLUG-based amplifiers in accordance with the present invention when operated with different single-section transmission line input couplers with characteristic impedance in the range from 1-3Ω.
Figure 18B:
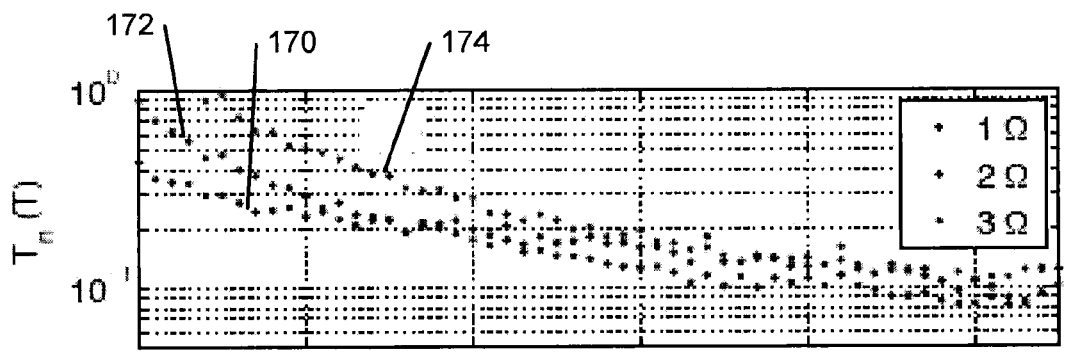
Figure 18C:
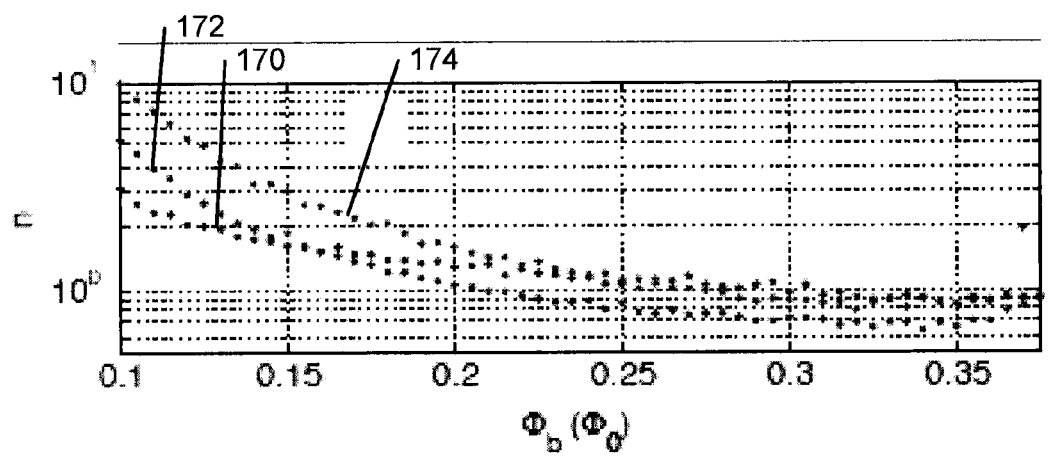

As an example, FIGS. 18A-18C are graphs illustrating frequency-dependent gain, noise temperature $T_n$, and added noise quanta n for SLUG-based amplifiers operated with different single-section transmission line input couplers with characteristic impedance in the range from 1-3Ω. In FIGS. 18A-18C, for each graph, three lines are shown representing $I_b=1.8\,I_0$ and an impedance of 1Ω (line 170), $I_b=1.9\,I_0$ and an impedance of 2Ω (line 172), and $I_b=2.0\,I_0$ and an impedance of 3 Ω (line 174).

Here, the full expressions (20) and (27) are used to calculate the frequency-dependent noise contribution of the amplifier in the thermal and quantum regimes, respectively. The length of the input coupler provides a bare quarter-wave resonance at 6.5 GHz; inductive loading by the SLUG-based amplifier pulls the operating frequency down to the desired value of 5 GHz. Note that the transmission line impedances considered here are readily achieved with thin-film microstrip technology: for example, a trace width of 10 µm and a dielectric with $\epsilon_r=4$ and thickness 100 nm corresponds to a characteristic impedance of 2Ω.

Figure 19A:
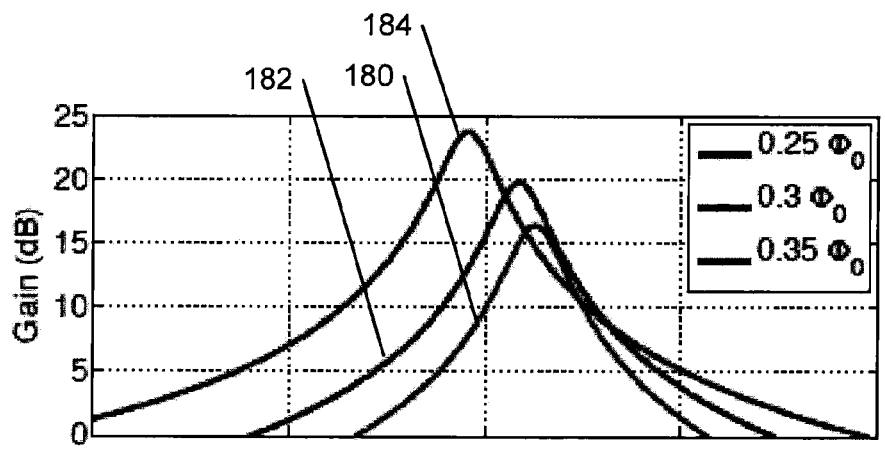
FIGS. 19A-19C are graphs illustrating frequency-dependent gain and noise performance of SLUG-based amplifiers in accordance with the present invention operated with different fixed single-section input coupling networks for gain, noise temperature in the thermal regime, and added noise in the quantum regime for a 5 GHz signal range, respectively.
Figure 19B:
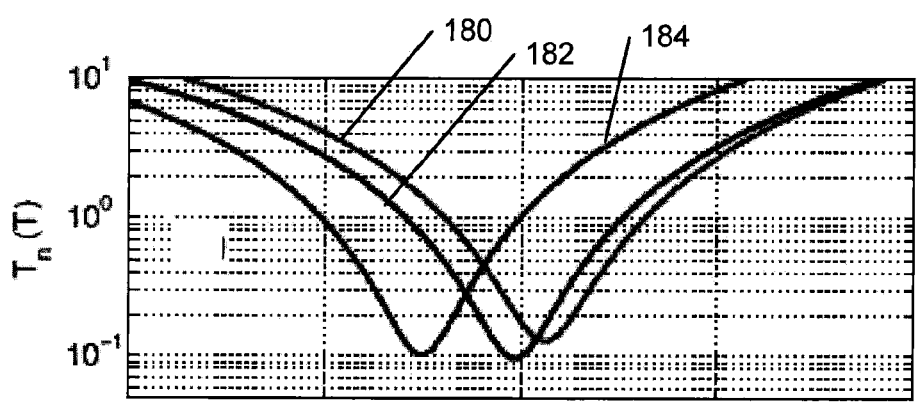
Figure 19C:
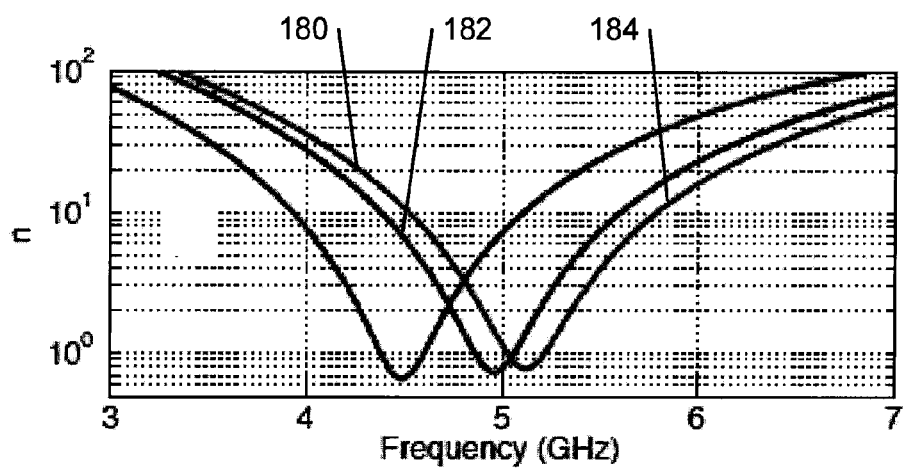

FIGS. 19A-19C are graphs illustrating frequency-dependent gain and noise performance of SLUG amplifiers operated with different fixed single-section input coupling networks for gain, noise temperature in the thermal regime, and added noise in the quantum regime for a 5 GHz SLUG amplifier, respectively. In FIGS. 19A-19C, for each graph, three lines are shown representing $0.25\Phi_0$ (line 180), $0.3\Phi_0$ (line 182), and $0.35\Phi_0$ (line 184). In FIGS. 19A-19C, the input matching network is a single transmission line section with bare quarter-wave resonance at 6.5 GHz and characteristic impedance of $2\Phi$ with device parameters of $\beta_L=1$, $\beta_C=0.8$, L=10 pH, C=50 fF, and $I_b=1.8I_0$.

Due to the non-vanishing cross spectral density $S_{VJ}$, the minimum noise temperature occurs at a frequency that is somewhat lower than the frequency of maximum gain. For a $Z_{0,i}=2\Phi$ input coupler, noise within 50% of the standard quantum limit can be achieved at a frequency where amplifier gain is 15 dB, and noise within a factor of 2 of the standard quantum limit at a frequency where gain is 18 dB.

Figure 20A:
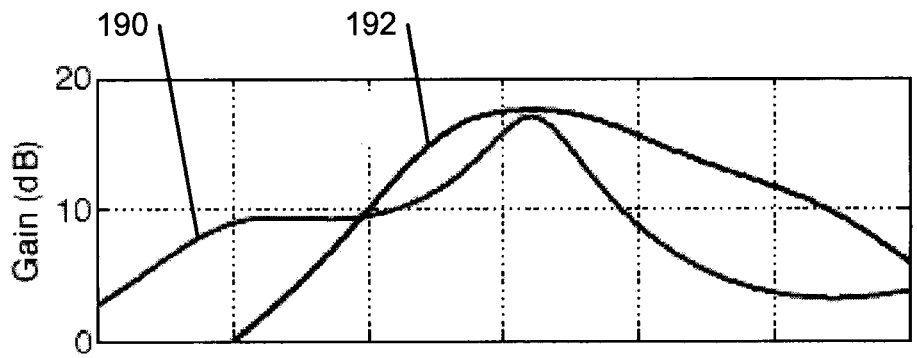
FIGS. 20A-20C are graphs illustrating frequency-dependent gain and added noise for SLUG-based amplifiers in accordance with the present invention operated with different three-section matching networks.
Figure 20B:
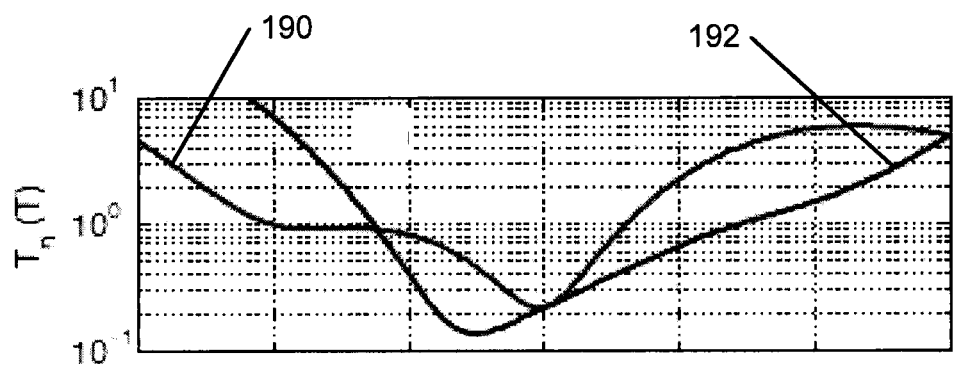
Figure 20C:
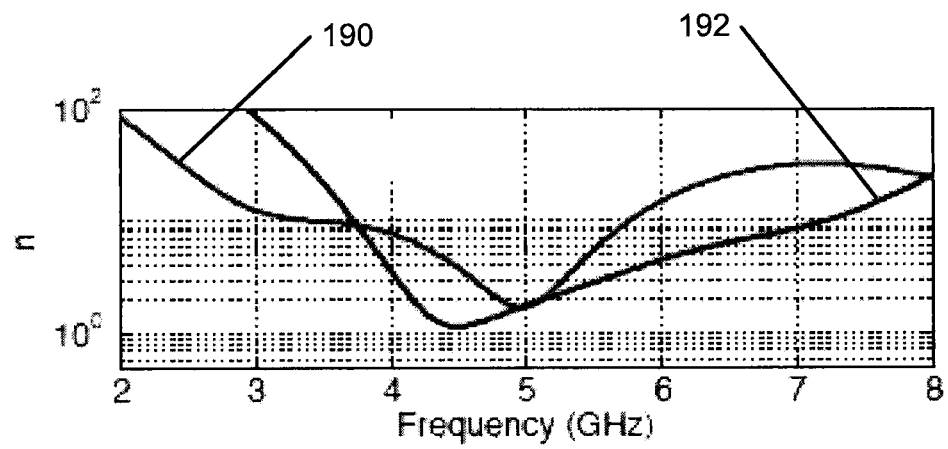

Further, it is possible to increase amplifier bandwidth significantly by coupling the input signal to the device via a multi-section transformer with stepped characteristic impedances. As an example, FIG. 20A-20C are graphs illustrating the frequency-dependent gain, noise temperature in the thermal regime, and added noise in the quantum regime, respectively, for broadband amplifiers incorporating a 10 pH SLUG element. The device characteristics are $\beta_L=1$, $\beta_C=0.8$, $I_b=1.8I_0$, and $\Phi_b=0.35\Phi I_0$. FIGS. 20A-20C illustrate frequency-dependent gain and added noise for amplifiers operated with different three-section matching networks. In each of FIGS. 20A-20C two lines are shown. Line 190 illustrates a three-section input matching network with quarter-wave resonances at 5 GHz and with characteristic impedances of 24.3Ω, 17.4Ω, and 3.0Ω derived from numerical minimization of the SLUG quantum noise over the band from 4.5 GHz to 5.5 GHz. Line 192 illustrates a matching network consisting of three sections with characteristic impedance 29.8Ω, 7.1Ω, and 1.1Ω followed by a series capacitance of 38 pF to tune out the imaginary part of the input impedance to the amplifier at a frequency of 5 GHz. With these exemplary operating parameters, the length of each transmission line section may be chosen to provide a bare quarter-wave resonance at 5 GHz, and the characteristic impedances determined by numerical minimization of the quantum noise contribution of the SLUG amplifier in the frequency range from 4.5 to 5.5 GHz.

Dynamic Range

Figure 21A:
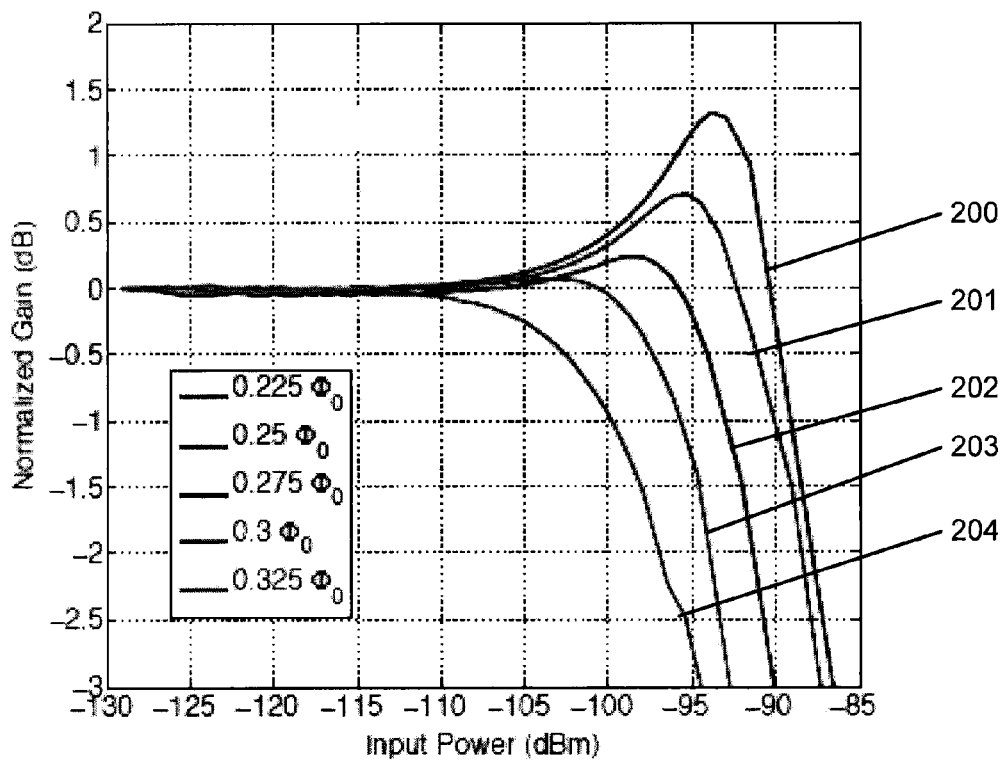
FIG. 21A is a graph illustrating normalized gain of the SLUG-based amplifier in accordance with the present invention versus signal power coupled to the device input over a range of bias parameters.

The strong nonlinearity of the SLUG amplifier device leads to gain compression and harmonic generation when the amplifier device is driven with a large-amplitude signal. It is important to verify that the dynamic range of the amplifier device will be sufficient for the desired application. FIG. 21A is a graph illustrating normalized gain of the above-described amplifier device in accordance with the present invention versus signal power coupled to the device input over a range of bias parameters for $\beta_L=1$, $\beta_C=0.8$, L=10 pH and C=50 fF. FIG. 21A shows 5 (five) lines corresponding to $0.225\Phi_0$ (line 200), $0.25\Phi_0$ (line 201), $0.275\Phi_0$ (line 202), $0.3\Phi_0$ (line 203), and $0.325\Phi_0$ (line 204). The plots of FIG. 21A were generated by solving the SLUG equations of motion (i.e., equation (10)) with a sinusoidal driving term of varying amplitude. Depending on bias point, the 1 dB compression point occurs somewhere in the range from −110 dBm to −90 dBm, corresponding to input powers from 10 fW to 1 pW. These 1 dB compression points are comparable to those seen in other SQUID-based microwave amplifiers and 1-2 orders of magnitude higher than those achieved with typical Josephson parametric amplifiers. Amplifier dynamic range can be determined by dividing the signal power at 1 dB compression by the noise power contributed by the SLUG-based amplifier over a given bandwidth.

Figure 21B:
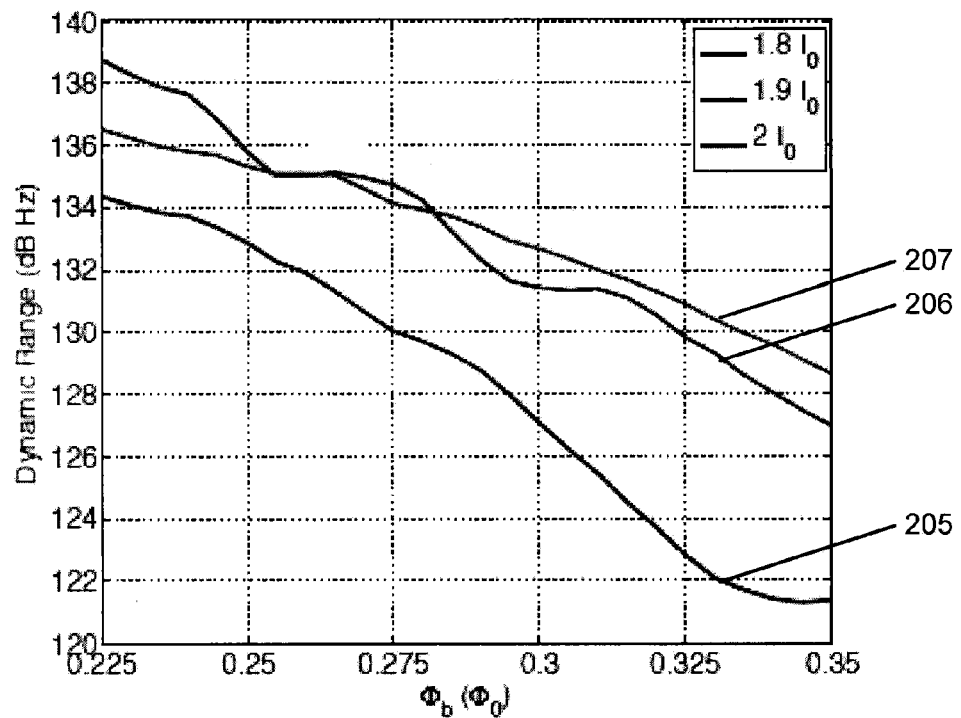
FIG. 21B is a graph illustrating dynamic range of the SLUG-based amplifier in accordance with the present invention versus flux for various current bias points.

FIG. 21B is a graph illustrating dynamic range of the SLUG-based amplifier in accordance with the present invention versus flux for various current bias points. FIG. 21B shows two lines corresponding to $1.8I_0$ (line 205), $1.9I_0$ (line 206), and $2I_0$ (line 207), with device parameters $\beta_L=1$, $\beta_C=0.8$, L=10 pH and C=50 fF. In the example shown in FIG. 21B, the zero-temperature quantum spectral density is used for the shunt resistors of the SLUG device. A typical value of 130 dB Hz is found, corresponding to a dynamic range of 40 dB in an amplifier bandwidth of 1 GHz. For applications related to dispersive readout of qubits in a circuit QED architecture, where the focus is on measurement of signals at the level of single microwave quanta in bandwidths of order 100 MHz to 1 GHz, the dynamic range of the SLUG amplifier, therefore, is more than adequate.

Effect Of Input Circuit Admittance

In the above analysis, the behavior of the isolated SLUG element has first been solved, and the device is treated as a "black box" with known scattering parameters for the purpose of designing appropriate matching networks. In reality, the nonvanishing admittance at the input and output of the SLUG-based amplifier will modify the device characteristics, and a complete treatment must take loading by the external circuit into account. The scattering parameters will depend on the particular realization of the matching network, and a full exploration of the space of design parameters can become tedious. However, it is found that the performance of the SLUG amplifier is not greatly affected by the nonvanishing input circuit admittance, particularly once modest steps are taken to decouple the SLUG element from the higher-order modes of the resonant input matching network.

Figure 22A:
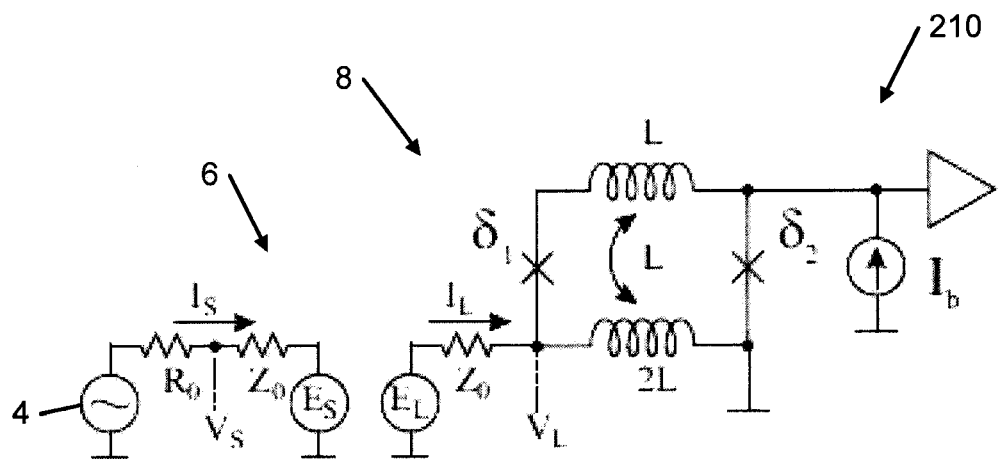
FIG. 22A is a circuit diagram of a circuit model of the SLUG amplifier modified for circuit analysis with finite input circuit admittance.

To take into account the admittance of the resonant input matching network, the junction equations of motion (i.e., equation (10)) can be modified to include an additional term representing the current drawn by the input circuit. FIG. 22A is a circuit diagram of a circuit model 210 of the SLUG amplifier modified for circuit analysis with finite input circuit admittance. The input transmission line 6 having impedance $Z_0$ can be exactly modeled as a pair of coupled, time dependent voltage sources $E_L$ and $E_S$. These are related to the voltages $V_{L,S}$ and currents $I_{L,S}$ at the two ends of the transmission line 6 as follows:

$$E_L(t)=V_S(t-t_D)+Z_0I_S(t-t_D)$$

$$E_S(t)=VL(t-t_D)+Z_0I_L(t-t_D), \quad (32)$$

In equation (32), $t_D$ is the propagation delay along the transmission line 6. The input current is then determined by the additional differential equation:

$$I_L = \frac{1}{L}\left[\frac{\Phi_0}{2\pi}(\delta_2 - \delta_1) - E_L + I_L Z_0\right] \quad (33)$$

Figure 23A:
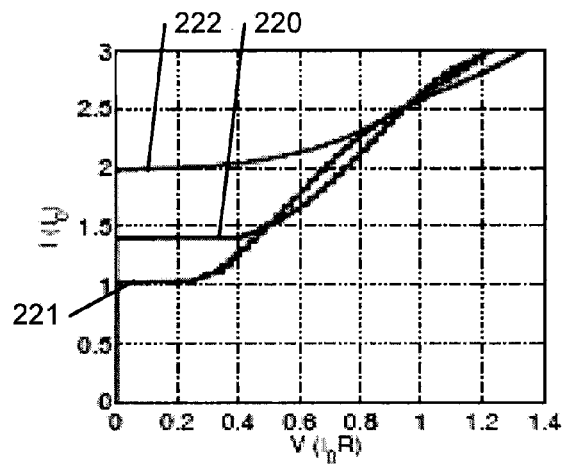
FIGS. 23A are 23B are graphs illustrating the I-V and V-$\Phi$ curves of a 10 pH, $\beta_L=1$ SLUG-based amplifier with a 10 GHz quarter-wave input transformer, respectively, with a transmission line input circuit with characteristic impedance $Z_0=2\Omega$ and bare quarter-wave resonance at 10 GHz.
Figure 23B:
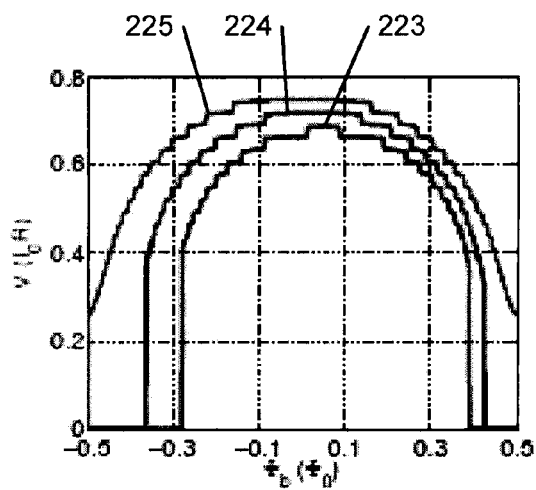
FIGS. 23C and 23D are graphs illustrating the I-V and V-$\Phi$ curves of a 10 pH, $\beta_L=1$ SLUG-based amplifier with a 10 GHz quarter-wave input transformer, respectively, with a transmission line input circuit with characteristic impedance $Z_0=2\Phi$ and bare quarter-wave resonance at 10 GHz incorporating a 60 pH filter inductor.
Figure 23C:
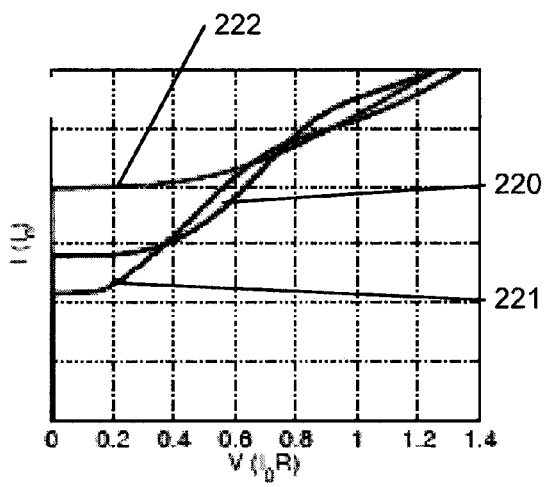
Figure 23D:
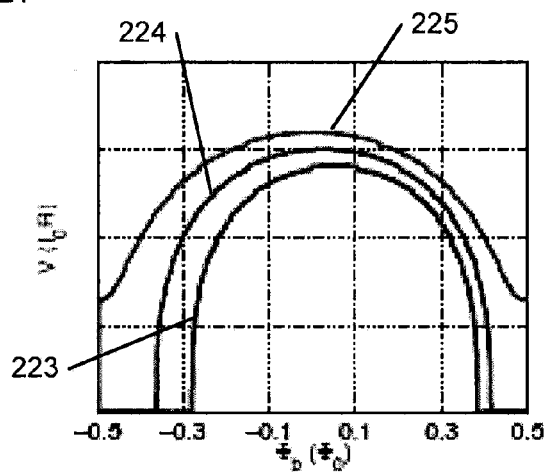

Using the modified equations of motion for the junction phases, the dc characteristics of the SLUG amplifier 8 can be calculated. FIGS. 23A are 23B are graphs illustrating the I-V and V-Φ curves of a 10 pH, $\beta_L=1$ SLUG amplifier with a 10 GHz quarter-wave input transformer, respectively, with a transmission line input circuit with characteristic impedance $Z_0=2\Omega$ and bare quarter-wave resonance at 10 GHz. In FIG. 23A three lines are shown corresponding to $\Phi_b=0\Phi_0$ (line 220), $\Phi_b=0.25\Phi_0$ (line 221), and $\Phi_b=0.5\Phi_0$ (line 222). In FIG. 23B three lines are shown corresponding to $I_b=1.8I_0$ (line 223), $I_b=1.9I_0$ (line 224), $I_b=2.0I_0$ (line 225). FIGS. 23C and 23D are graphs illustrating the I-V and V-Φ curves of a 10 pH, $\beta_L=1$ SLUG amplifier with a 10 GHz quarter-wave input transformer, respectively, with a transmission line input circuit with characteristic impedance $Z_0=2\Omega$ and bare quarter-wave resonance at 10 GHz incorporating a 60 pH filter inductor. FIGS. 23C and 23D illustrate that the resonant structure is suppressed through the incorporation of the filter inductor. In FIG. 23C three lines are shown corresponding to $\Phi_b=0\Phi_0$ (line 220), $\Phi_b=0.25\Phi_0$ (line 221), and $\Phi_b=0.50\Phi_0$ (line 222). In FIG. 23D three lines are shown corresponding to $I_b=1.8I_0$ (line 223), $I_b=1.9I_0$ (line 224), $I_b=2.0I_0$ (line 225).

Figure 22B:
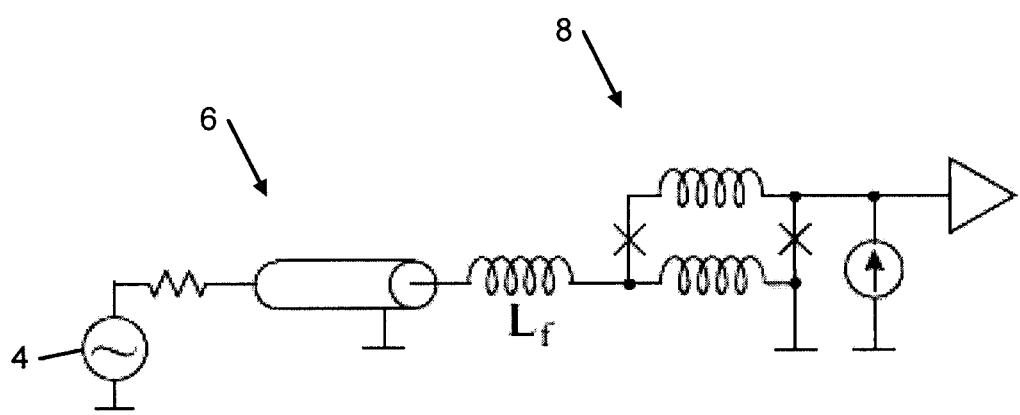
FIG. 22B is a circuit diagram of a circuit model designed to suppress the resonances of the input by inserting a filter inductor $L_f$ at the input of the SLUG-based amplifier in accordance with the present invention.

Referring to FIGS. 23A and 23B, a sharp Shapiro step-like structure is observed at voltages corresponding to Josephson frequencies that are integer multiples of the half-wave resonance of the input circuit. While quantum fluctuations of the SLUG shunts smooth out this structure somewhat, it can be desirable to decouple to the SLUG amplifier from the higher-order standing wave modes of the input circuit, as these modes may limit amplifier dynamic range and lead to excess noise. Referring to FIG. 22B, to suppress the resonances of the input, it is possible to insert a filter inductor $L_f$ on the order tens of pH between the input 6 and the SLUG amplifier 8.

Figure 24A:
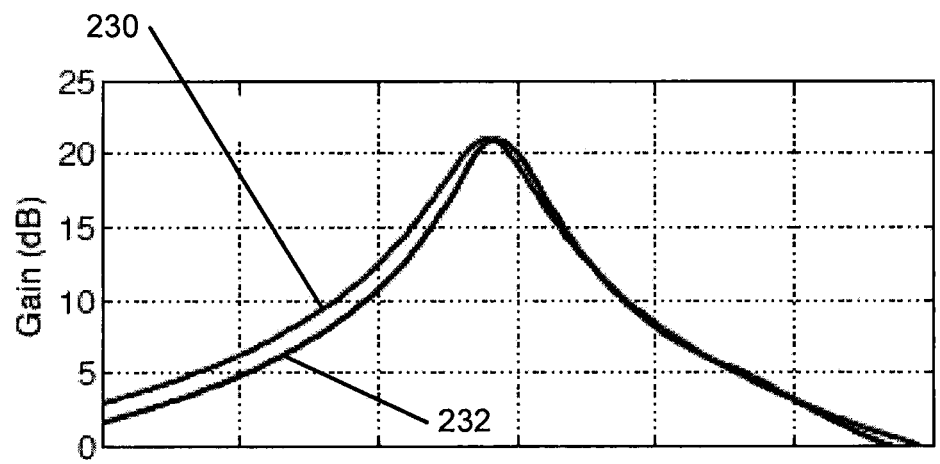
FIG. 24A is a graph illustrating the frequency-dependent gain for the SLUG-based amplifier in accordance with the present invention.

It is now possible to calculate the gain and noise properties of the complete circuit of FIG. 22B by performing a full integration of the amplifier equations of motion. Power gain and bandwidth are determined by driving the amplifier with a sinusoidal input tone and monitoring the output of the SLUG amplifier 8 at the excitation frequency. FIG. 24A is a graph illustrating the frequency-dependent gain for the SLUG amplifier with $\beta_L=1$, $\beta_C=0.8$, L=10 pH, C=50 fF, $I_b=1.8I_0$, and $\Phi_b=0.35\Phi_0$. The input matching network includes a 2Ω transmission line section with bare quarter-wave resonance at 10 GHz followed by a filter inductor $L_f=60$ pH. FIG. 24A depicts two lines. The first line (element 230) depicts values calculated using the "black box" scattering parameters of the isolated slug, and the second line (element 232) depicts values calculated by solving the full circuit model of FIGS. 22A and 22B using a transmission line input with characteristic impedance $Z_0=2$ and a length corresponding to a bare quarter-wave resonance at 10 GHz, significantly higher than the amplifier operating frequency of 4.5 GHz in order to compensate for the additional reactive loading by the filter inductor.

The agreement with the full circuit simulation is favorable (e.g., between lines 230 and 232 of FIG. 24A), confirming that the filter inductance has effectively isolated the modes of the SLUG amplifier 8 and the transmission line input circuit 6.

To calculate the frequency-dependent noise temperature $T_n(f)$, it is possible to simulate a "hot load/cold load" experiment where the power spectra $S_{V,cold}$ and $S_{V,hot}$ at the device output are compared for source resistances at temperatures T=0 and $T_b$, respectively. In the thermal regime, this provides equation (34).

$$T_n(f) = \frac{S_{V,cold}(f)}{S_{V,hot}(f) - S_{V,cold}(f)} T_b \quad (34)$$

In the quantum regime, this provides equation (35).

$$\frac{\coth[hf/2k_B(T_b+T_n)]}{\coth(hf/2k_BT_n)} = \frac{S_{V,hot}}{S_{V,cold}} \quad (35)$$

Figure 24B:
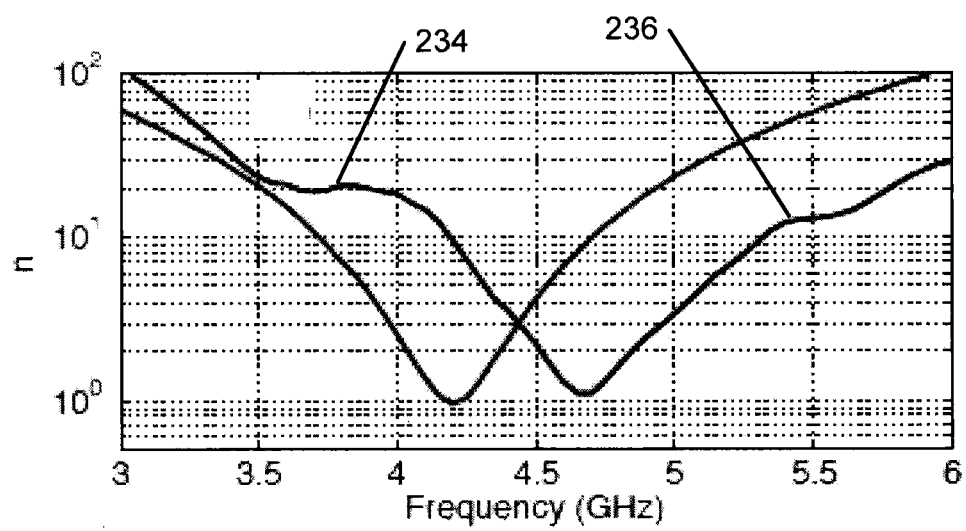
FIG. 24B is a graph illustrating the added noise of a 5 GHz SLUG-based amplifier calculated with the full circuit model and with the "black box" scattering parameters of the isolated SLUG for the SLUG circuit.

The added noise number can then be obtained from equation (26). FIG. 24B is a graph illustrating the added noise of a 5 GHz SLUG amplifier calculated with the full circuit model and with the "black box" scattering parameters of the isolated SLUG for the SLUG circuit with $\beta_L=1$, $\beta_C=0.8$, L=10 pH, C=50 fF, $I_b=1.8I_0$, and $\Phi_b=0.35\Phi_0$. The input matching network consists of a 2Ω transmission line section with bare quarter-wave resonance at 10 GHz followed by a filter inductor $L_f=60$ pH. FIG. 24B depicts two lines. The first line (element 234) depicts values calculated using the "black box" scattering parameters of the isolated slug, and the second line (element 236) depicts values calculated by solving the full circuit model of FIGS. 22A and 22B. The noise magnitude is similar in the two cases, although the full circuit solution predicts a higher frequency for the minimum in the amplifier noise contribution. The shift in the frequency-dependent noise characteristics may be due to a modification of the circulating current spectral density $S_J$ by the nonvanishing admittance of the input network.

Hot Electron Effects

At millikelvin temperatures electrons decouple from the phonons, and the electron temperature of the SLUG shunts can be significantly higher than the bath temperature. It has been shown that the electron temperature $T_e$ in a metal thin film resistor is given by equation (36).

$$T_e = (P/\Sigma\Omega + T_P^5)^{1/5} \quad (36)$$

In equation (36), P is the power deposited in the resistor, Σ is a materials parameter equal to approximately $2\times10^9$ W/m³K⁵, Ω is the normal metal volume, and $T_P$ is the phonon temperature. The elevated temperature of the shunt resistors translates directly to elevated noise temperature of the amplifier. For a device with fixed $\beta_C$, the power dissipation in the shunts scales as $1/R^3$. Hot electron effects will be particularly relevant for the microwave amplifiers discussed here, as optimal performance is achieved for small SLUG inductance, corresponding to large critical currents and small shunt resistances.

One approach for promoting thermalization of the SLUG shunts at millikelvin temperatures is to fabricate large-volume normal metal cooling fins in metallic contact with the resistor element. At low temperatures, the inelastic diffusion length is on the order of several mm. Thus, the cooling fins allow hot electrons generated in a localized region of the shunt resistor to diffuse over a large volume and thermalize with cold electrons and phonons.

Researchers have demonstrated a significant reduction in the electron temperature of dc SQUIDs incorporating 400× 400 μm² CuAu cooling fins with thickness around 1 μm, with measured electron temperatures under 40 mK. A similar approach has been used to suppress hot-electron effects and reduce the noise temperature of microstrip SQUID amplifiers operated in the radio-frequency regime. It is possible to integrate normal metal cooling fins with area of order 1 mm² into a standard microwave SLUG amplifier geometry without compromising the microwave integrity of the circuit. The addition of such cooling fins should make it possible to attain electron temperatures under 100 mK for the device parameters considered in this disclosure, corresponding to operation far in the quantum regime for frequencies in the range from 5-10 GHz.

The present disclosure describes a high-frequency amplifier, such as for RF or microwave signals, that may have a SLUG architecture. Some advantages of the design presented herein over competing approaches to low-noise, high-frequency amplification of signals having characteristics associated with quantum computing readouts are as follows:

1. The low-inductance amplifier geometry is compact, straightforward to model at RF or microwave frequencies, and readily integrated into a transmission line environment.

2. The amplifier input and output can be well-matched to a 50, 75, or other Ω transmission line impedance, facilitating broadband operation. Moreover, multisection transmission-line input couplers provide a clear path to attaining bandwidths of order GHz while maintaining excellent gain and noise performance.

3. It is possible to decouple the SLUG modes from the input modes, allowing separate optimization of the gain element and the input matching network.

4. The dynamic range of the amplifier is large relative to that required for qubit readout or circuit QED applications.

5. Due to its relatively small magnetic sensing area, the SLUG gain element is extremely robust and substantially immune to ambient magnetic field fluctuations when compared to other amplifier topologies, such as SQUID-based designs.

The SLUG amplifier presented herein may be attractive in the context of qubit readout in a circuit QED architecture, either as a near quantum-limited first-stage amplifier or as an ultralow noise postamplifier following a Josephson paramp. Other possible applications include fundamental studies of microwave photon counting statistics, or ultralow noise amplification for dark-matter axion detection.

In the present system, multi-section transmission-line input couplers provide a mechanism for operating at bandwidths on the order of gigahertz (GHz), while maintaining gain and noise performance that exceeds that of prior devices. Due to the present system's relatively small magnetic sensing area, the SLUG gain element is robust and can be immune to ambient magnetic field fluctuations. The device's robustness and immunity to ambient magnetic fields allows for its use in harsh environments such as in space applications.

In various implementations of the present system, devices having high critical current density may achieve noise performance approaching the standard quantum limit in the frequency range from 5-10 GHz, with a gain of about 15 dB for a single-stage device and instantaneous bandwidths on the order of 1 GHz.

These performance characteristics allow for use of the device in a number of potential applications including reading-out quantum bits in a super-conducting or semiconducting quantum information processing network, rapid single flux quantum (RSFQ) superconducting logic/devices, and satellite communications where operating temperatures and required noise temperatures are very low.

The present system has been described in terms of one or more preferred embodiments, and it should be appreciated that many equivalents, alternatives, variations, and modifications, aside from those expressly stated, are possible and within the scope of the invention.

The invention claimed is:

1. A linear amplifier system configured to amplify high-frequency signals, the amplifier comprising:

an input providing a direct coupling configured to receive a high-frequency input signal having a frequency in at least one of a radiofrequency (RF) and microwave range;

an amplifier including a dielectric material separating at least two superconducting layers forming an amplifier loop configured to receive the high-frequency input signal and deliver an amplified signal, the amplifier presenting an inductive short to ground at the input, and the amplified signal being a linear amplification of the high-frequency input signal; and an output providing a direct coupling configured to deliver the amplified signal.

2. The linear amplifier system of claim 1 wherein the amplifier forms a superconducting low-inductance undulatory galvanometer (SLUG) architecture.

3. The linear amplifier system of claim 2 wherein the SLUG architecture is arranged as a symmetric SLUG.

4. The linear amplifier system of claim 1 wherein the amplifier is configured to present a complex input impedance that is frequency dependent.

5. The linear amplifier system of claim 1 wherein the input includes a tapered transmission line matching section configured to increase a bandwidth of the amplifier system without degrading a gain of the amplifier system.

6. The linear amplifier system of claim 1 wherein the input includes an input transformer having stepped transmission line impedances selected to increase a bandwidth of the amplifier system without degrading a gain of the amplifier system.

7. The linear amplifier system of claim 1 wherein the input is configured to directly couple to a transmission line impedance.

8. The linear amplifier system of claim 1 wherein the input includes a thin-film microstrip connected to a transmission line output.

9. The linear amplifier system of claim 1 wherein at least one of the input and the output is configured to be coupled to a transmission line environment.

10. The linear amplifier system of claim 9 wherein the transmission line environment includes a 50 ohm environment.

11. The linear amplifier system of claim 1 wherein the amplifier is configured to operate as a phase-insensitive linear amplifier.

12. A quantum information processing network configured to receive and relay high-frequency signals, the quantum information processing network comprising:

a signal source configured to act as at least one of a quantum computing source, a source of qubits, and a linear cavity resonator and at least one of transmitting and reflecting a high-frequency signal having a frequency in at least one of a radiofrequency (RF) and microwave range;

a transmission line network configured to have an approximately 50 ohm environment and configured to receive the high-frequency signal; and an amplifier coupled directly to the transmission line network through an input configured to receive the high-frequency signal and an output to deliver an amplified high-frequency signal, the amplifier being configured to present at least one of an inductive short to ground at the input, and the amplified high-frequency signal being a linear amplification of the hiqh-frequency signal.

13. The quantum information processing network of claim 12 wherein the amplifier includes a dielectric material separating at least two superconducting layers forming an amplifier loop configured to receive the high-frequency signal and deliver the amplified high-frequency signal.

14. The quantum information processing network of claim 12 wherein the amplifier is arranged in a superconducting low-inductance undulatory galvanometer (SLUG) architecture.

15. The quantum information processing network of claim 14 wherein the SLUG architecture forms a symmetric SLUG architecture.

16. The quantum information processing network of claim 12 wherein the transmission line network includes a tapered transmission line matching section coupled to the input of the amplifier configured to increase a bandwidth of the amplifier without degrading a gain of the amplifier.

17. The quantum information processing network of claim 12 wherein the input includes an input transformer having stepped transmission line impedances selected to increase a bandwidth of the amplifier without degrading a gain of the amplifier.

18. The quantum information processing network of claim 12 wherein the amplifier is configured to operate as a phase-insensitive linear amplifier.

* * * * *